US012761167B2

(12) United States Patent
Sekiya et al.

(10) Patent No.: US 12,761,167 B2
(45) Date of Patent: Oct. 13, 2026

(54) NMR DETECTOR

(71) Applicants: UNIVERSITY OF YAMANASHI, Kofu (JP); JEOL Ltd., Tokyo (JP)

(72) Inventors: Naoto Sekiya, Kofu (JP); Takanori Fujita, Tokyo (JP)

(73) Assignees: UNIVERSITY OF YAMANASHI, Kofu (JP); JEOL Ltd., Tokyo (JP)

( * ) Notice: Subject to any disclaimer, the term of this patent is extended or adjusted under 35 U.S.C. 154(b) by 166 days.

(21) Appl. No.: 18/811,868

(22) Filed: Aug. 22, 2024

(65) Prior Publication Data

US 2025/0067692 A1 Feb. 27, 2025

(30) Foreign Application Priority Data

Aug. 25, 2023 (JP) ................................ 2023-137412

(51) Int. Cl.
*G01N 24/08* (2006.01)
*G01R 33/34* (2006.01)

(52) U.S. Cl.
CPC ....... *G01N 24/08* (2013.01); *G01R 33/34023* (2013.01)

(58) Field of Classification Search
CPC .............. G01N 24/08; G01R 33/34023; G01R 33/56563; G01R 33/34007
See application file for complete search history.

(56) References Cited

U.S. PATENT DOCUMENTS 7,456,631 B1 11/2008 Shino
2002/0190715 A1 12/2002 Marek
2003/0071623 A1 4/2003 Marek
2003/0141871 A1* 7/2003 Marek .............. G01R 33/34061 324/309
2005/0228210 A1 10/2005 Muntermann
2014/0320131 A1 10/2014 Brey et al.
2017/0336485 A1 11/2017 Hobo et al.
2018/0120389 A1 5/2018 Freytag

FOREIGN PATENT DOCUMENTS

JP 2002341001 A 11/2002
JP 2003202367 A 7/2003
JP 2005503190 A 2/2005
JP 2009047445 A 3/2009
JP 2017203755 A 11/2017
JP 2018109605 A 7/2018
JP 2019190832 A 10/2019

OTHER PUBLICATIONS

Office Action issued in JP2023137412 on Jul. 29, 2025.

* cited by examiner

*Primary Examiner* — G.M. A Hyder
(74) *Attorney, Agent, or Firm* — The Webb Law Firm

(57) ABSTRACT

A sample coil for NMR detection includes a first coil unit and a second coil unit placed with a sample therebetween. In the first coil unit, a first coil and a second coil are formed on a first plane of a first substrate. In the second coil unit, a third coil and a fourth coil are formed on a second plane of a second substrate. Each of the coils is a superconducting coil. When viewed from an x direction orthogonal to the first plane and the second plane, the first coil and the second coil do not intersect the sample, and, similarly, the third coil and the fourth coil do not intersect the sample.

10 Claims, 22 Drawing Sheets

Comparative Example

Comparative Example

Comparative Example

RO

NMR DETECTOR

CROSS REFERENCE TO RELATED APPLICATION

This application claims priority to Japanese Patent Application No. 2023-137412 filed Aug. 25, 2023, the disclosure of which is hereby incorporated by reference in its entirety.

BACKGROUND OF THE DISCLOSURE

Field of the Disclosure

The present disclosure relates to an NMR detector used in an NMR apparatus.

Description of Related Art

As a magnetic resonance measurement apparatus, there is known a nuclear magnetic resonance (NMR) apparatus.

In the NMR apparatus, an NMR probe is placed in a static magnetic field. The NMR probe includes a sample coil for transmission and reception. During transmission, the sample coil radiates onto a sample an electromagnetic wave for generating a high-frequency magnetic field, and, during reception, the sample coil detects an NMR signal from the sample. The sample coil is also called an NMR coil, an RF (Radio Frequency) coil, or a detection coil.

When it is desired to perform NMR measurement of a solution sample or the like with as high a sensitivity as possible, the NMR measurement is performed by an NMR apparatus having a cryogenic NMR probe. In general, when an electric resistance of the sample coil is reduced by cooling the sample coil to a very low temperature, a Q factor (quality factor) of the sample coil is increased. Because of this, the signal-to-noise ratio (SNR) can be increased. In other words, when the sample coil is cooled to the very low temperature, because a detection sensitivity of the sample coil is increased, the SNR can be increased. The Q factor is represented by the following formula.

$$Q=2\pi fL/R$$

In the formula, f represents resonance frequency, L represents inductance of the sample coil, and R represents resistance of the sample coil.

In typical NMR measurement, a sample coil made of copper is used as the sample coil. This sample coil is cooled by a cooling system to a temperature of about 20 K (kelvin). In this manner, NMR measurement with a higher sensitivity is realized in comparison to a case where an NMR probe at room temperature is used.

In order to measure the NMR signal, an electromagnetic wave having a frequency equal to the resonance frequency intrinsic to the sample is radiated onto the sample from the sample coil in the cryogenic NMR probe. With the radiation of the electromagnetic wave, a high-frequency magnetic field is generated in a sample space. The sample coil and the sample are placed in a static magnetic field generated by a superconducting magnet. When the static magnetic field is non-uniform in an active region of the sample, a distortion may occur in an NMR spectrum, or a situation may arise in which the NMR signal itself is not detected. In order to avoid these situations, normally, a static magnetic field distribution is adjusted using a shim coil, so that uniformity of the static magnetic field is maintained.

In typical NMR measurement, the copper sample coil generates the high-frequency magnetic field necessary for NMR excitation in a direction perpendicular to a direction of the static magnetic field. When a uniform high-frequency magnetic field is generated in the sample and is applied onto the sample, superior NMR is caused in the sample, and the NMR signal from the sample is detected by the sample coil. The detected NMR signal is processed by a spectrometer, and an NMR spectrum is generated.

Here, even when the copper sample coil is cooled, there is a limit to the reduction of the electric resistance of the sample coil. Because of this, there also is a limitation in the increase of the detection sensitivity of the NMR signal.

In consideration of this, attempts have been made to use a sample coil formed from a superconductor (superconducting material), in order to increase the detection sensitivity of the NMR signal.

However, normally, a film of the superconductor can only be formed on a planar substrate. In addition, due to the Meissner effect unique to superconductors, the static magnetic field is significantly distorted, resulting in a possibility of occurrence of a distortion in the NMR spectrum.

In regard to this point, JP 2003-201367 A discloses a coil apparatus having an additional superconductor structure. The additional superconductor structure compensates for the disturbance effect caused by magnetization of the superconductor separated from a resonator. JP 2002-341001 A discloses an RF reception coil apparatus having a planar substrate element on which a superconductor structure is placed.

As described, a sample coil using a superconductor has been proposed, but such a sample coil has the following problem.

Namely, similar to the case in which the NMR signal is detected using a copper sample coil, the following conditions (1) to (3) must be satisfied in order to detect the NMR signal.

(1) A high-frequency magnetic field which is uniform and as strong as possible must be applied onto the sample.

(2) A high-frequency magnetic field having the same frequency as the resonance frequency of a nuclear species (nuclide) to be measured must be applied onto the sample.

(3) Distortion of the static magnetic field must be minimized as possible.

However, when a sample coil formed from the superconductor is used, due to the Meissner effect unique to superconductors, the static magnetic field is significantly distorted, and, as a result, a distortion may occur in the NMR spectrum.

As the Q factor of the sample coil becomes larger, influence of a dielectric loss at the sample to an electric field concentrated part of the sample coil becomes stronger. Because of this, when the sample is inserted into the NMR probe, (more specifically, when the sample is inserted into a space surrounded by the sample coil), an amount of reduction of the Q factor of the sample coil becomes large.

Depending on a degree of the reduction of the Q factor, the Q factor of the sample coil formed from the superconductor may be reduced to a value similar to the Q factor of the copper sample coil. Because of this, unless the problem of reduction of the Q factor is resolved, the use of the superconductor for the sample coil may become meaningless.

An exemplary object of the present disclosure lies in increasing the detection sensitivity of the NMR signal by suppressing occurrence of the distortion of the static magnetic field, and suppressing the reduction of the Q factor at the time of insertion of the sample, when a sample coil formed from a superconductor is used.

SUMMARY OF THE DISCLOSURE

According to one aspect of the present disclosure, there is provided an NMR detector comprising: a first coil unit that includes a first superconducting coil, and a first plane on which the first superconducting coil is formed; and a second coil unit that includes a second superconducting coil, and a second plane on which the second superconducting coil is formed, and that opposes the first coil unit, wherein the first coil unit and the second coil unit radiate electromagnetic waves for generating a high-frequency magnetic field onto a sample placed in a static magnetic field between the first coil unit and the second coil unit, and detect an NMR signal from the sample, the first superconducting coil does not intersect the sample when viewed from a direction orthogonal to the first plane, and the second superconducting coil does not intersect the sample when viewed from a direction orthogonal to the second plane.

In an NMR detector according to an exemplary embodiment of the present disclosure, a z direction which is a direction of the static magnetic field, an x direction which is orthogonal to the z direction and which is a direction of alignment of the first coil unit and the second coil unit, and a y direction orthogonal to the x direction and the z direction are defined, and, when the two superconducting coils (that is, the first and second superconducting coils) and the sample are projected in parallel along the x direction, the two superconducting coils do note intersect the sample (that is, the two superconducting coils do not overlap the sample). With this structure, disturbance of the static magnetic field is effectively prevented or reduced. The first plane and the second plane are yz planes.

In another exemplary configuration, the first coil unit may include a first coil, and a second coil which is placed at a position distanced from the first coil by at least a distance corresponding to a width of the sample. The second coil unit may include a third coil, and a fourth coil which is placed at a position distanced from the third coil by at least a distance corresponding to the width of the sample. The first coil and the second coil are aligned in the y direction, and the third coil and the fourth coil are also aligned in the y direction. The width of the sample is a width in the y direction.

In another exemplary configuration, each of the first coil, the second coil, the third coil, and the fourth coil may include an electric field concentrated part. The electric field concentrated part is a local part in which an electric field which is larger than an electric field generated at parts other than the electric field concentrated part is generated.

In another exemplary configuration, each of the first coil, the second coil, the third coil, and the fourth coil may include a part proximal to the sample and a part distal from the sample. The electric field concentrated part may be formed in the part distal from the sample.

In an exemplary embodiment of the present disclosure, the electric field concentrated part may have a first coil end formed from a plurality of first coil elements arranged in a comb shape, and a second coil end formed from a plurality of second elements arranged in a comb shape. The plurality of first elements and the plurality of second elements may be provided alternately or in a staggered manner.

In another exemplary configuration, the electric field concentrated part may have a shape in accordance with a resonance frequency of the sample.

In another exemplary configuration, each of the first coil, the second coil, the third coil, and the fourth coil may include a current concentrated part. In a resonated state of each of the coils, a current distribution is generated in each of the coils. A peak part (a local part including a peak and a periphery thereof) in the current distribution is the current concentrated part.

In another exemplary configuration, each of the first coil, the second coil, the third coil, and the fourth coil may include a part proximal to the sample and a part distal from the sample. The current concentrated part may be formed in the part proximal to the sample.

In another exemplary configuration, a full length of each of the first coil, the second coil, the third coil, and the fourth coil may correspond to a half wavelength of the high-frequency magnetic field applied to the sample.

In another exemplary configuration, each of the first coil, the second coil, the third coil, and the fourth coil may be a coil placed on a planar substrate. An inner edge of a corner portion in each of the coils may have a curved line shape.

In an NMR detector according to an exemplary embodiment of the present disclosure, the first coil unit includes a first substrate having the first plane on which the first coil and the second coil, which are aligned in the y direction, are formed, and the second coil unit includes a second substrate having the second plane on which the third coil and the fourth coil, which are aligned in the y direction, are formed. When viewed from the x direction, the first coil and the second coil do not overlap the sample, and the third coil and the fourth coil do not overlap the sample. The first plane and the second plane are orthogonal to the x direction; that is, the first plane and the second plane are yz planes.

BRIEF DESCRIPTION OF THE DRAWINGS

Embodiment(s) of the present disclosure will be described based on the following figures, wherein.

DESCRIPTION OF NON-LIMITING EMBODIMENTS OF THE DISCLOSURE

Figure 1:
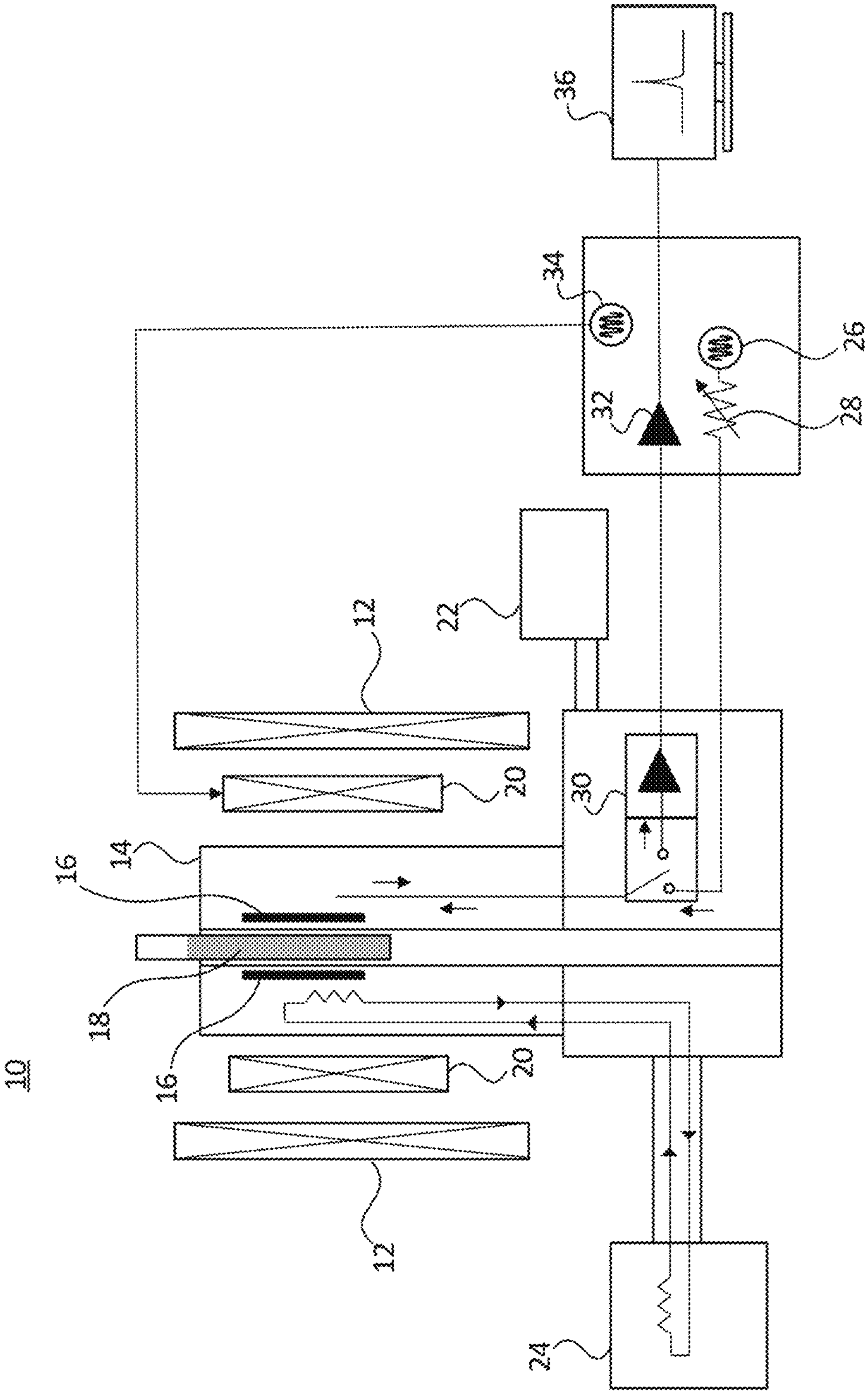
FIG. 1 is a diagram schematically showing a structure of an NMR apparatus according to an embodiment of the present disclosure.

An NMR apparatus according to an embodiment of the present disclosure will now be described with reference to FIG. 1. FIG. 1 is a diagram schematically showing a structure of an NMR apparatus 10. The NMR apparatus 10 is an apparatus which measures NMR generated in a sample.

The NMR apparatus 10 includes a superconducting magnet 12, which is an apparatus that generates a static magnetic field $B_0$. At a center part of the superconducting magnet 12, a hollow part which extends in a vertical direction is formed. An NMR probe 14 has a circular tubular shape extending in the vertical direction, and is inserted into the hollow part of the superconducting magnet 12. In FIG. 1, for the convenience of the description, the NMR probe 14, and a shim coil 20 and the superconducting magnet 12 positioned at the periphery of the NMR probe 14 are shown with respective cross-sectional shapes. The NMR probe 14 is a cryogenic probe.

A detection circuit (not shown) is provided in the NMR probe 14. The detection circuit is a circuit tuning and matching circuit, and includes a pair of sample coils 16, a variable capacitor for tuning (not shown), a variable capacitor for matching (not shown), and the like. With the variable capacitor for tuning and the variable capacitor for matching, tuning and matching are performed, and characteristics of the detection circuit are optimized.

The pair of sample coils 16 are placed near a sample 18 in the NMR probe 14. That is, as shown in FIG. 1, the two sample coils 16 are placed near the sample 18, at the left and the right of the sample 18, respectively. The sample coils 16 apply a high-frequency magnetic field $B_1$ to the sample 18, and detect an NMR signal generated from the sample 18. Each of the sample coils 16 is formed from a superconductor (superconducting material).

The shim coil 20 is placed between the superconducting magnet 12 and the NMR probe 14. The shim coil 20 is a coil for adjusting a distribution of the static magnetic field $B_0$, by being controlled by a shim power supply 34.

The inside of the NMR probe 14 is maintained in a state of vacuum by an evacuation system 22. In addition, the inside of the NMR probe 14 is cooled by a cooling system 24. For example, the sample coils 16 and a periphery thereof are cooled to a temperature of about 20K. With this configuration, the cryogenic NMR probe 14 is realized.

When the NMR signal is measured, a high-frequency oscillator 26 generates a high-frequency current having a frequency which is equal to a resonance frequency intrinsic to the sample 18. The high-frequency current is adjusted to a suitable value by an attenuator 28, and is supplied to the sample coils 16 within the NMR probe 14.

The sample coils 16 and the sample 18 are placed within the static magnetic field $B_0$ generated by the superconducting magnet 12. When the static magnetic field $B_0$ is non-uniform in an active region of the sample 18, a distortion may be caused in the measured NMR spectrum, or a situation may arise in which the NMR signal itself is not detected. In order to avoid these situations, the distribution of the static magnetic field $B_0$ is adjusted by the shim coil 20.

The sample coils 16 generate, with radiation of an electromagnetic wave onto the sample, a high-frequency magnetic field $B_1$ necessary for the NMR excitation, in a direction perpendicular to the direction of the static magnetic field $B_0$. When a uniform high-frequency magnetic field $B_1$ is applied to the sample 18, and a uniform static magnetic field $B_0$ is applied to the sample 18, NMR is caused in the sample, and the NMR signal from the sample is detected by the sample coils 16. The sample coils 16 corresponds to an example of an NMR detector.

The NMR signal detected by the sample coils 16 is amplified by a low-temperature preamplifier 30, and a preamplifier 32. A personal computer 36 applies signal processing such as a Fourier transform to the amplified signal, to generate an NMR spectrum. The NMR spectrum is displayed, for example, on a display.

As structures other than the sample coils 16, a known structure may be employed.

Figure 2:
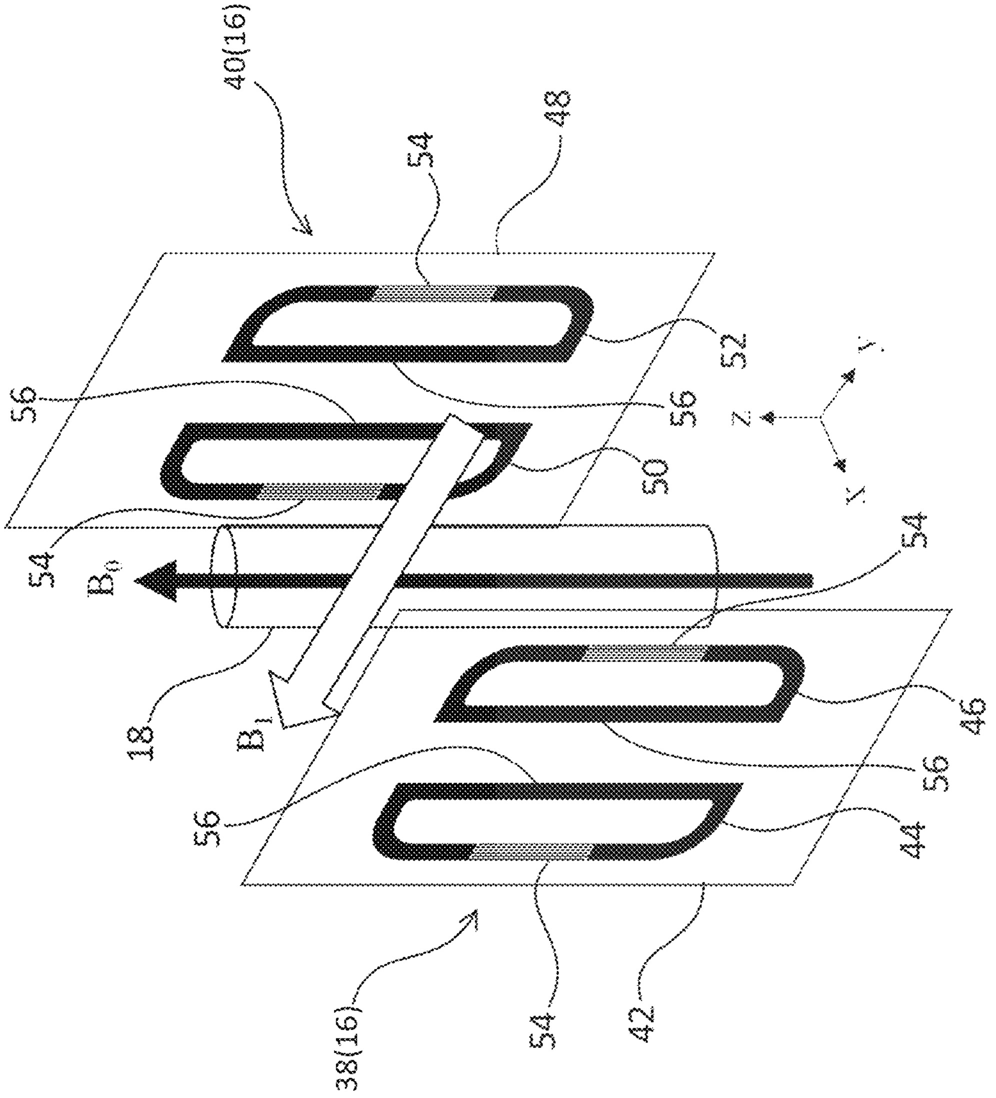
FIG. 2 is a perspective diagram showing sample coils according to an embodiment of the present disclosure.

The pair of sample coils 16 will now be described with reference to FIGS. 2 and 3. FIG. 2 is a perspective diagram showing the pair of sample coils 16, and FIG. 3 is a diagram showing one of the sample coils 16, as viewed from an x direction.

Figure 3:
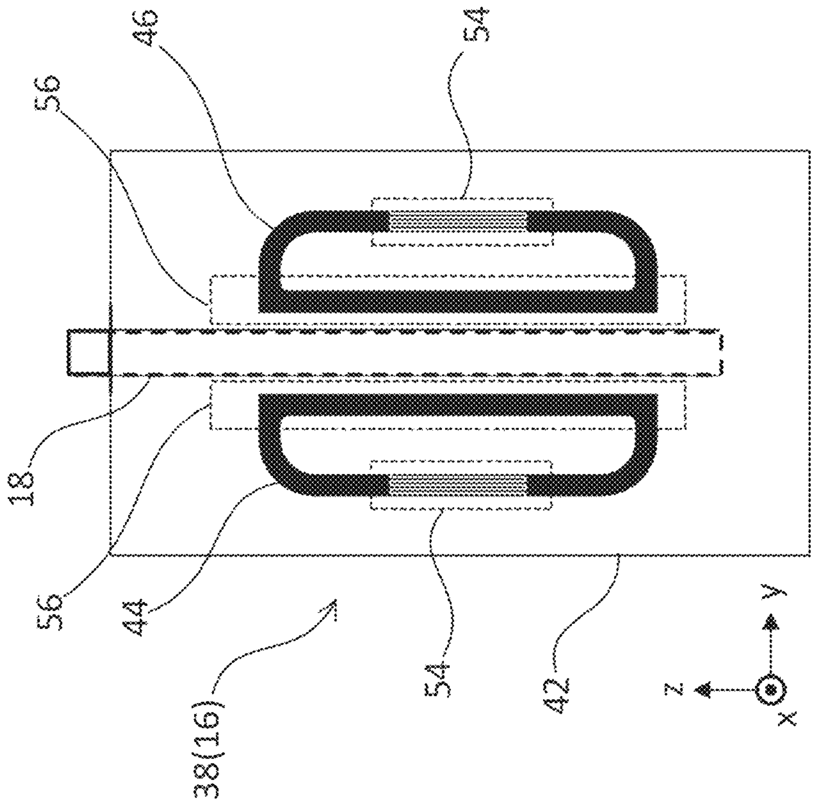
FIG. 3 is a diagram of the sample coils according to the embodiment of the present disclosure, as viewed from an x direction.

As shown in FIGS. 2 and 3, a three-dimensional orthogonal coordinate system is defined, which is formed from an x axis, a y axis, and a z axis, which are orthogonal to each other. The direction of the static magnetic field $B_0$ coincides with a direction of positive coordinates along the z axis.

As shown in FIGS. 1 and 2, the pair of sample coils 16 are placed at positions near the sample 18, and in a manner to sandwich the sample 18. In the following, the pair of sample coils 16, including a first coil unit 38 and a second coil unit 40, will be described with different reference numerals. The first coil unit 38 and the second coil unit 40 are placed to oppose each other with the sample 18 (more specifically, a sample tube storing the sample 18) therebetween. The first coil unit 38 and the second coil unit 40 are placed with a space therebetween in the x direction.

The first coil unit 38 includes a planar substrate 42, a coil 44, and a coil 46. The second coil unit 40 includes a planar substrate 48, a coil 50, and a coil 52.

The coil 44 corresponds to an example of a first coil. The coil 46 corresponds to an example of a second coil. The coil 50 corresponds to an example of a third coil. The coil 52 corresponds to an example of a fourth coil.

The planar substrates 42 and 48 are, for example, sapphire substrates. The planar substrates 42 and 48 are placed opposing each other with the sample 18 (more specifically, the sample tube storing the sample 18) therebetween. The planar substrates 42 and 48 are placed with a space therebetween in the x direction.

More specifically, the planar substrate 42 and the planar substrate 48 are placed to be parallel with each other. With this configuration, the first coil unit 38 and the second coil unit 40 are placed to be parallel with each other. The planar substrate 42 and the planar substrate 48 may be placed strictly parallel with each other (that is, parallel in the mathematical sense), or may be placed not strictly parallel with each other. For example, the planar substrates 42 and 48 may be placed with an angle deviated from "parallel" in the mathematical sense within an allowable range of the detection sensitivity of the NMR signal. That is, the first coil unit 38 and the second coil unit 40 may be placed with an angle deviated from "parallel" in the mathematical sense, within an allowable range of the detection sensitivity of the NMR signal. In the example configuration shown in FIGS. 2 and 3, a plane formed by the planar substrate 42 is a yz plane. This is similarly applicable to the planar substrate 48.

The coils 44 and 46 are formed on a surface (first plane) of the planar substrate 42. The coils 50 and 52 are formed on a surface (second plane) of the planar substrate 48. The coils 44, 46, 50, and 52 are formed from a superconductor such as YBCO (yttrium-based superconductor, $YBa_2Cu_3O_7$). For example, through processes such as film formation and etching, the coils 44 and 46 are formed on the first plane of the planar substrate 42, and the coils 50 and 52 are formed on the second plane of the planar substrate 48. The first plane and the second plane are yz planes.

Each of the coils 44 and 46 has a shape as illustrated in FIGS. 2 and 3 on the planar substrate 42. More specifically, the coils 44 and 46 have a single-turn shape. Similarly, each of the coils 50 and 52 has a shape as illustrated in FIG. 2 on the planar substrate 48. More specifically, the coils 50 and 52 have a single-turn shape. The coils 44, 46, 50, and 52 are identical in shape and size but have different orientations. As described above, the number of windings (number of turns) of each of the coils 44, 46, 50, and 52 is one turn. No particular limitation is imposed on the number of windings, and the number of windings may alternatively be a plurality of turns.

Each of the first coil unit 48 and the second coil unit 40 applies the high-frequency magnetic field $B_1$ onto the sample 18, and detects the NMR signal from the sample 18. With the configuration in which the first coil unit 38 and the second coil unit 40 are placed in parallel with each other, the high-frequency magnetic field $B_1$ having a direction orthogonal to the direction of the static magnetic field $B_0$ is generated. In the example configuration shown in FIGS. 2 and 3, in the sample space, the direction of the high-frequency magnetic field $B_1$ coincides with a direction of the negative coordinates along the y axis.

The coils 44 and 46 are placed on the planar substrate 42 in an inverted form from each other with reference to a vertical central axis of the planar substrate 42. In addition, the coil 46 is placed on the planar substrate 42 at a position distanced from the coil 44 in the y direction by at least a distance corresponding to a width of the sample 18. That is, the coils 44 and 46 are placed at positions not overlapping a region corresponding to the sample 18 on the planar substrate 42 (that is, within the yz plane). In other words, the coils 44 and 46 are placed at positions which do not intersect the sample 18 when viewed from the direction orthogonal to the planar substrate 42 (that is, the x direction). In this manner, the pair of superconducting coils included in the first coil unit 38 are placed in a manner to not intersect the sample 18 when viewed from the direction (that is, the x direction) orthogonal to the plane formed by the first coil unit 38 (that is, the yz plane).

The coils 50 and 52 are placed on the planar substrate 48 in an inverted form from each other with reference to a vertical center axis of the planar substrate 48. In addition, the coil 52 is placed on the planar substrate 48 at a position distanced from the coil 50 in the y direction by at least a distance corresponding to the width of the sample 18. That is, the coils 50 and 52 are placed at positions not overlapping a region corresponding to the sample 18 on the planar substrate 48 (that is, within the yz plane). In other words, the coils 50 and 52 are placed at positions which do not intersect the sample 18 when viewed from the direction orthogonal to the planar substrate 48 (that is, the x direction). In this manner, the pair of superconducting coils included in the second coil unit 40 are placed in a manner to not intersect the sample 18 when viewed from the direction (that is, the x direction) orthogonal to the plane formed by the second coil unit 40 (that is, the yz plane).

With the pair of superconducting coils included in the first coil unit 38 and the pair of the superconducting coils included in the second coil unit 40 being placed to not intersect the sample 18 when viewed from the x direction, the distortion of the static magnetic field $B_0$ formed in a space (sample space) in which the sample 18 is placed can be reduced. This effect will be described later in detail.

The coil 44 and the coil 50 are placed at positioned opposing each other along the x axis, and are placed in parallel with each other. Similarly, the coil 46 and the coil 52 are placed at positions opposing each other along the x direction, and are placed in parallel with each other.

The coil 44 and the coil 52 are placed at positions diagonal from each other with reference to the x axis. Similarly, the coil 46 and the coil 50 are placed at positions diagonal from each other with reference to the x axis. The coil 44 and the coil 52 are placed with the sample 18 therebetween. Similarly, the coil 46 and the coil 50 are placed with the sample 18 therebetween.

Each of the coils 44, 46, 50, and 52 includes an electric field concentrated part 54. Each of the coils 44, 46, 50, and 52 includes a part proximal to the sample 18 and a part distal from the sample 18. The electric field concentrated part 54 is included in the part distal from the sample 18. Further, each of the coils 44, 46, 50, and 52 includes a current concentrated part 56. The current concentrated part 56 is included in the part proximal to the sample 18. In the following, the part proximal to the sample 18 will be referred to as a "proximal part", and the part distal from the sample 18 will be referred to as a "distal part".

Specifically, the proximal part refers to an inner part (first vertical part) of each of the coils 44, 46, 50, and 52, and the distal part is an outer part (second vertical part) of each of the coils 44, 46, 50, and 52. The electric field concentrated part 54 is formed at a center of an outer part of each of the coils 44, 46, 50, and 52. The current concentrated part 56 corresponds to an inner part or a center part of each of the coils 44, 46, 50, and 52. An upper end of the first vertical part and an upper end of the second vertical part are connected to each other via a first horizontal part. A lower end of the first vertical part and a lower end of the second vertical part are connected to each other via a second horizontal part.

In each of the coils 44 and 46, a part proximal to the center of the planar substrate 42 corresponds to the proximal part. Similarly, in each of the coils 50 and 52, a part proximal to the center of the planar substrate 48 corresponds to the proximal part.

The distal part of the coil 44 is a part which has a shape along the z axis, and which is separated in the y direction from the proximal part of the coil 44. The distal part of the coil 46 is a part which has a shape along the z axis, and which is separated in the y direction from the proximal part of the coil 46. The distal part of the coil 50 is a part which has a shape along the z axis, and which is separated in the y direction from the proximal part of the coil 50. The distal part of the coil 52 is a part which has a shape along the z axis, and which is separated in the y direction from the proximal part of the coil 52.

The electric field concentrated part 54 of the coil 44 and the electric field concentrated part 54 of the coil 50 are formed at positions opposing each other in the x direction. The electric field concentrated part 54 of the coil 46 and the electric field concentrated part 54 of the coil 52 are formed at positions opposing each other in the x direction.

The electric field concentrated part 54 of the coil 44 and the electric field concentrated part 54 of the coil 52 are formed at positions diagonal from each other with reference to the x axis. The electric field concentrated part 54 of the coil 46 and the electric field concentrated part 54 of the coil 50 are formed at positions diagonal from each other with reference to the x axis.

The current concentrated part 56 of the coil 44 and the current concentrated part 56 of the coil 50 are formed at positions opposing each other in the x direction. The current concentrated part 56 of the coil 46 and the current concentrated part 56 of the coil 52 are formed at positions opposing each other in the x direction.

The current concentrated part 56 of the coil 44 and the current concentrated part 56 of the coil 52 are formed at positions diagonal from each other with reference to the x axis. The current concentrated part 56 of the coil 46 and the current concentrated part 56 of the coil 50 are formed at positions diagonal from each other with reference to the x axis.

Figure 4:
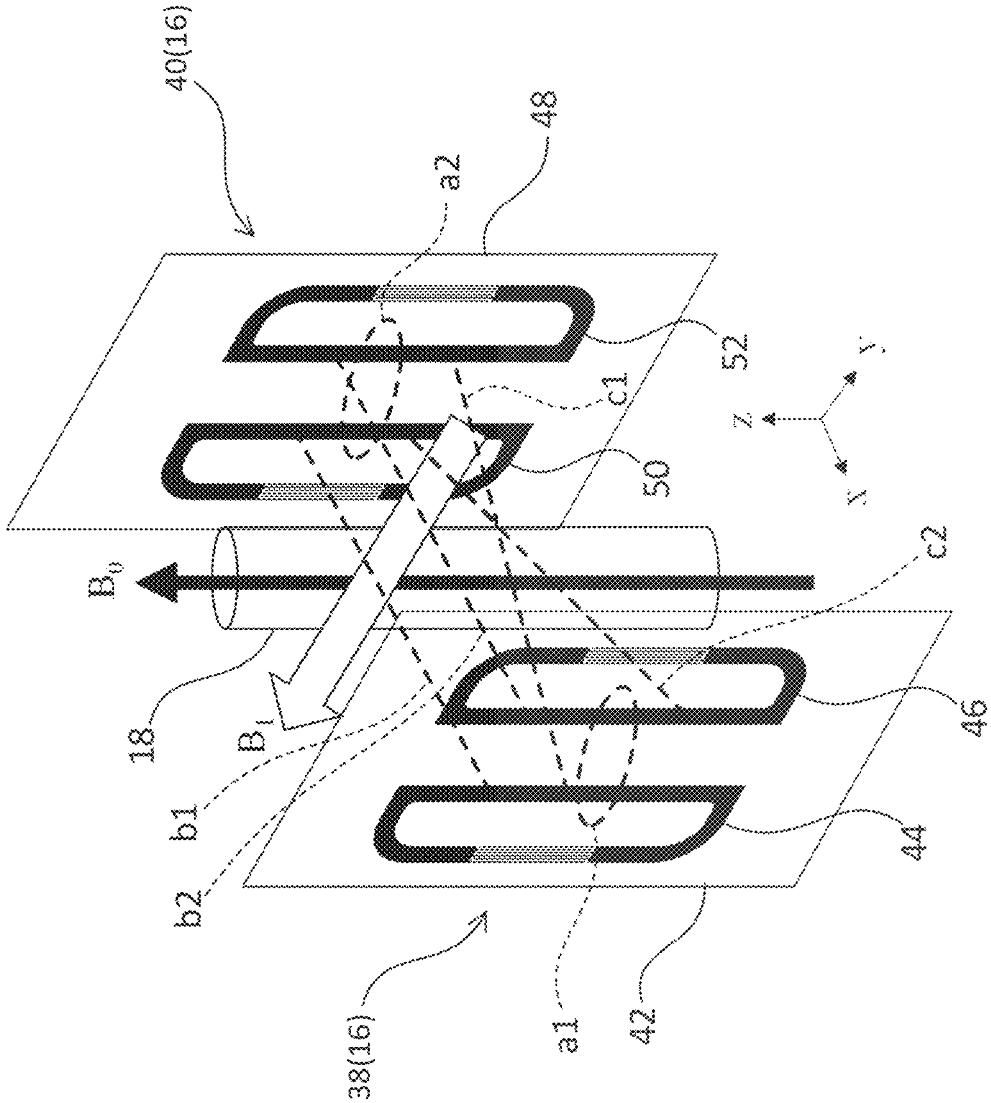
FIG. 4 is a perspective diagram showing the sample coils according to the embodiment of the present disclosure.

Each of the coils 44, 46, 50, and 52 functions as a superconducting resonator, and the coils are magnetically coupled with each other. FIG. 4 shows the state of the coupling. FIG. 4 is a perspective diagram showing the sample coil 16.

A coupling a1 is a magnetic coupling between the coil 44 and the coil 46. A coupling a2 is a magnetic coupling between the coil 50 and the coil 52. The couplings a1 and a2 may be said to be couplings in the y direction.

A coupling b1 is a magnetic coupling between the coil 44 and the coil 50. A coupling b2 is a magnetic coupling between the coil 46 and the coil 52. The couplings b1 and b2 may be said to be couplings in the x direction.

A coupling c1 is a magnetic coupling between the coil 44 and the coil 52. A coupling c2 is a magnetic coupling between the coil 46 and the coil 50. The couplings c1 and c3 may be said to be couplings in a diagonal direction.

As described, the coils 44, 46, 50, and 52 are magnetically coupled with each other. Because of this, when a high-frequency current is applied to the coils 44, 46, 50, and 52, the coils 44, 46, 50, and 52 resonate, and a uniform high-frequency magnetic field $B_1$ (that is, a high-frequency combined magnetic field) can be generated in the sample space.

Figure 5:
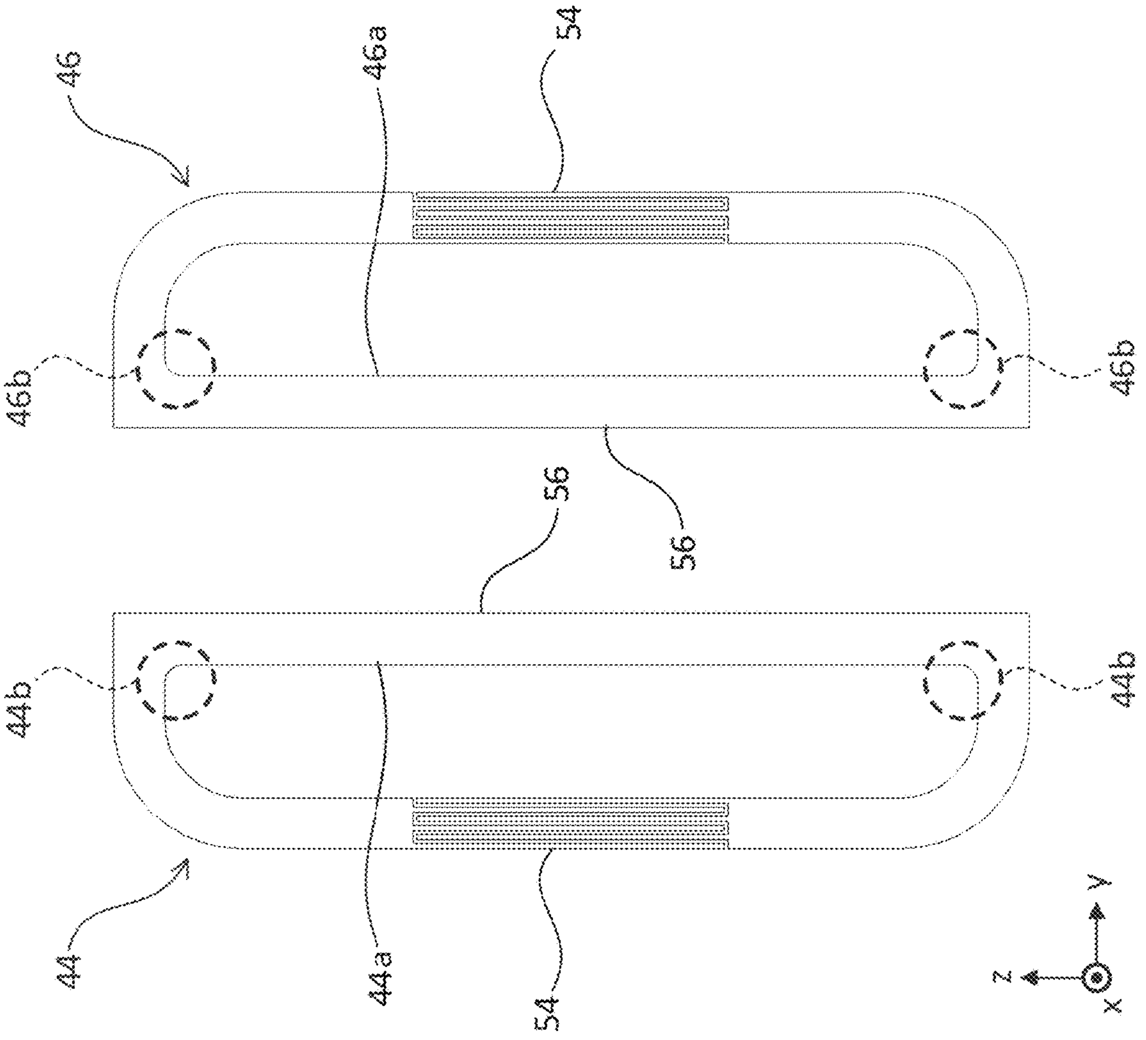
FIG. 5 is a diagram of a first coil unit according to an embodiment of the present disclosure, as viewed from the x direction.
Figure 6:
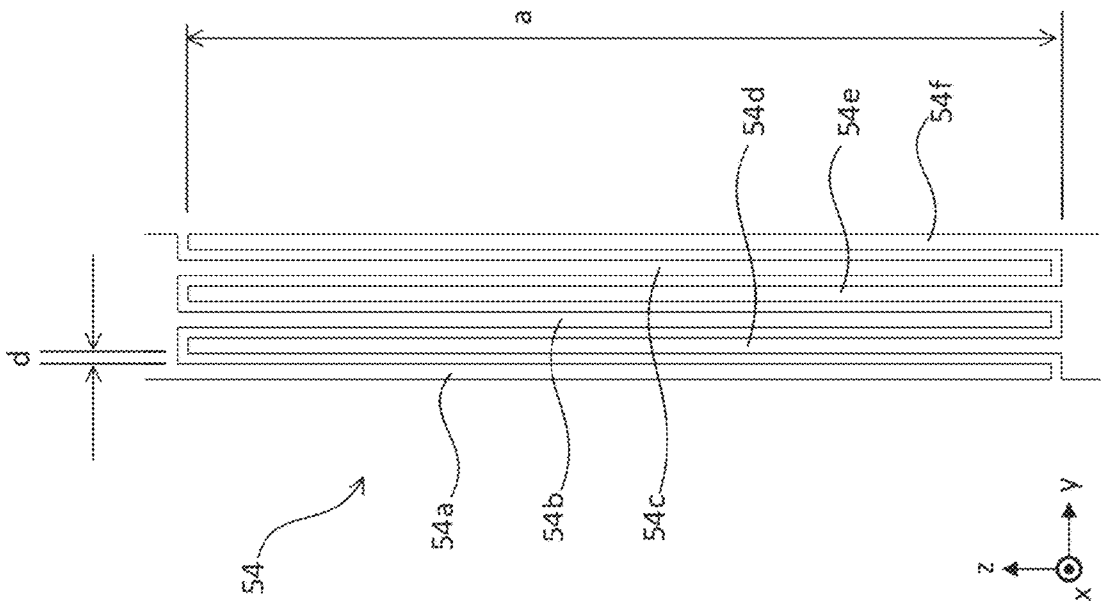
FIG. 6 is an enlarged view of an electric field concentrated part.
Figure 7:
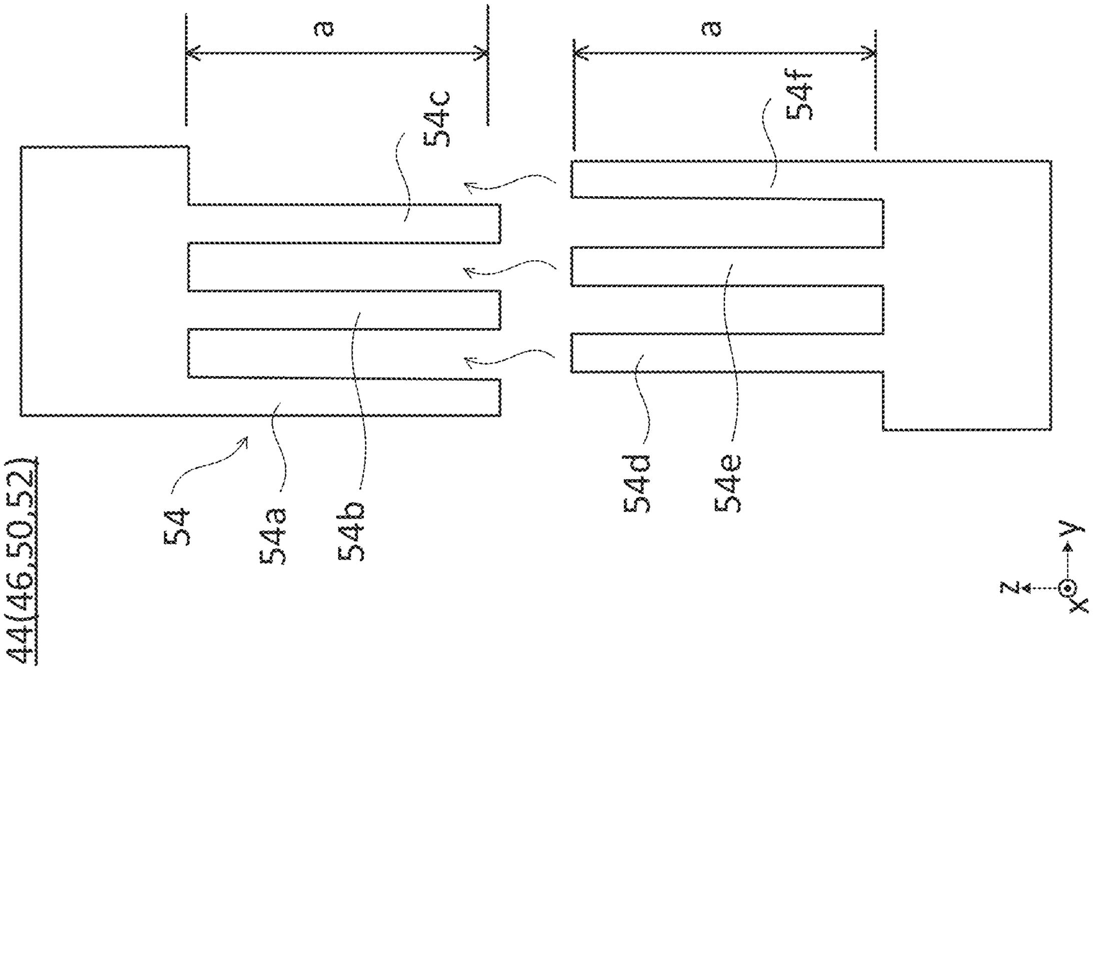
FIG. 7 is a diagram showing a state in which the electric field concentrated part is virtually decomposed.

A structure of the electric field concentrated part 54 will now be described with reference to FIGS. 5 to 7. FIG. 5 is a diagram showing the first coil unit 38, as viewed from the x direction. FIG. 5 shows the coils 44 and 46, but does not show the planar substrate 48. FIG. 6 is an enlarged view of the electric field concentrated part 54. FIG. 7 is a diagram showing a state in which the electric field concentrated part 54 is virtually decomposed. The coils 50 and 52 have shapes similar to the shapes shown in FIG. 5.

The electric field concentrated part 54 is formed from a first coil end and a second coil end in the coils 44 and 46. The first end is formed from a plurality of coil elements (a plurality of first coil elements) aligned in the y direction, and the second end is formed from a plurality of coil elements (a plurality of second coil elements) aligned in the y direction. Each of the first end and the second end has a comb shape. The first end and the second end are in a relationship of being engaged in a non-contacting manner. The plurality of first coil elements and the plurality of second coil elements are alternately provided or arranged in a staggered manner in the y direction.

Specifically, as shown in FIG. 6, the electric field concentrated part 54 includes coil elements 54*a* to 54*f*. Each of the coil elements 54*a* to 54*f* has a straight line shape, and the coil elements are aligned in the y direction on the surface of the planar substrate 48.

The number and the shape of the coil elements illustrated in the drawings are merely exemplary. In the example configuration shown in FIG. 6, the electric field concentrated part 54 is formed from 6 coil elements, but alternatively, the electric field concentrated part 54 may be formed from fewer than 6 coil elements or more than 6 coil elements. Alternatively, a part or all of the coil elements may be formed in a curved line shape.

As shown in FIG. 7, for example, the coil elements 54*a*, 54*b*, and 54*c* form the first end of the coil 44, and the coil elements 54*d*, 54*e*, and 54*f* form the second end of the coil 44. As shown by arrows shown in FIG. 7, the ends are engaged in a non-contacting manner, to form the electric field concentrated part 54.

A dielectric loss caused in the sample 18 during the generation of the high-frequency magnetic field affects the electric field concentrated part of the sample coil. More specifically, when a high-frequency, alternative current, electric field is applied to a dielectric, each dipole in the dielectric attempts to follow the inversion of the electric field. As a result, heat is generated due to friction between the dipoles, which in turn becomes thermal noise, and, consequently, a cause of loss. When this heat affects the electric field concentrated part, the Q factor is reduced. Because of this, in typical NMR measurement, when the sample is inserted into the NMR probe, the Q factor of the sample coil is reduced. On the other hand, in the present embodiment, because the electric field concentrated part 54 is formed in the distal part, the influence of the dielectric loss caused in the sample on the electric field concentrated part 54 can be reduced in comparison to a case in which the electric field concentrated part 54 is formed in the proximal part. As a result, the reduction of the Q factor when the sample is inserted into the NMR probe can be prevented or reduced.

Figure 8:
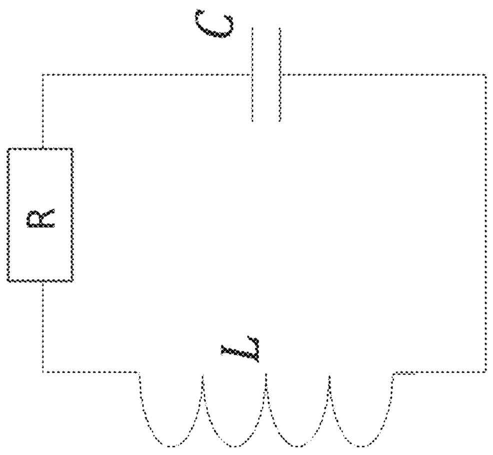
FIG. 8 is a diagram showing an equivalent circuit of a coil.

FIG. 8 shows an equivalent circuit of each of the coils 44, 46, 50, and 52. R represents resistance, L represents inductance (coefficient of induction), and C represents capacitance (electrostatic capacity).

As shown in FIGS. 6 and 7, a length (length in the z direction) of each of the coil elements 54*a* to 54*f* is a length a. As shown in FIG. 6, a distance (distance in the y direction) between the coil elements is a distance d. A thickness (thickness in the x direction) of each of the coils 44, 46, 50, and 52 is a thickness t.

A resonance frequency f of the sample coil 16 is expressed by the following Equation (1). The capacitance C is expressed by the following Equation (2). A parameter ε represents a dielectric constant (constant). A parameter S represents an area (=length a×thickness t). Because the thickness t of each of the coils 44, 46, 50, and 52 is very thin, the capacitance C is expressed by Equation (2).

[Equation 1]

$$f = \frac{1}{2\pi\sqrt{LC}} \quad (1)$$

[Equation 2]

$$C = \varepsilon\frac{S}{d} = \left(\varepsilon\frac{at}{d}\right) \propto \varepsilon\frac{a}{d} \quad (2)$$

As shown in Equation (2), the capacitance C can be changed by changing the length a of each of the coil elements 54*a* to 54*f*. Therefore, the resonance frequency f of the sample coil 16 can be changed by changing the length a.

Figure 9:
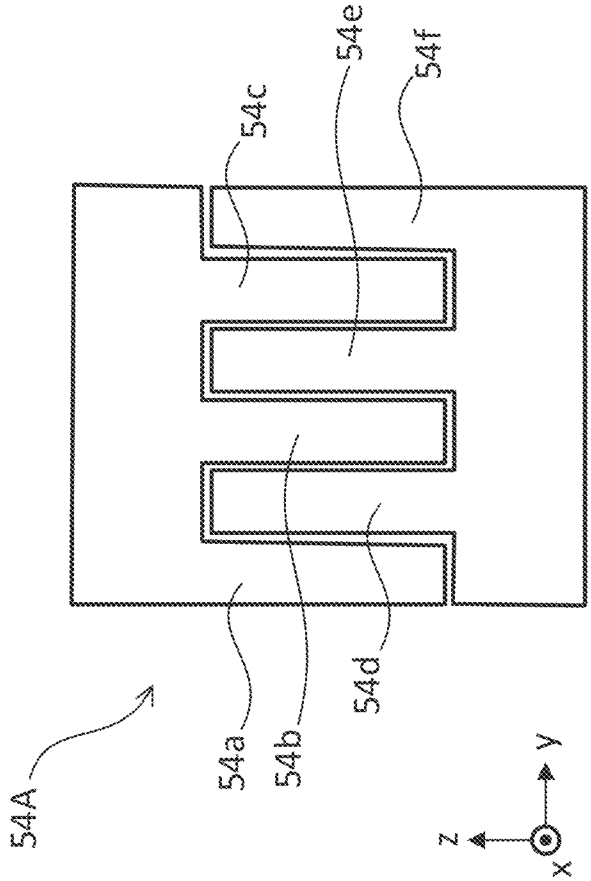
FIG. 9 is an enlarged view of the electric field concentrated part.
Figure 10:
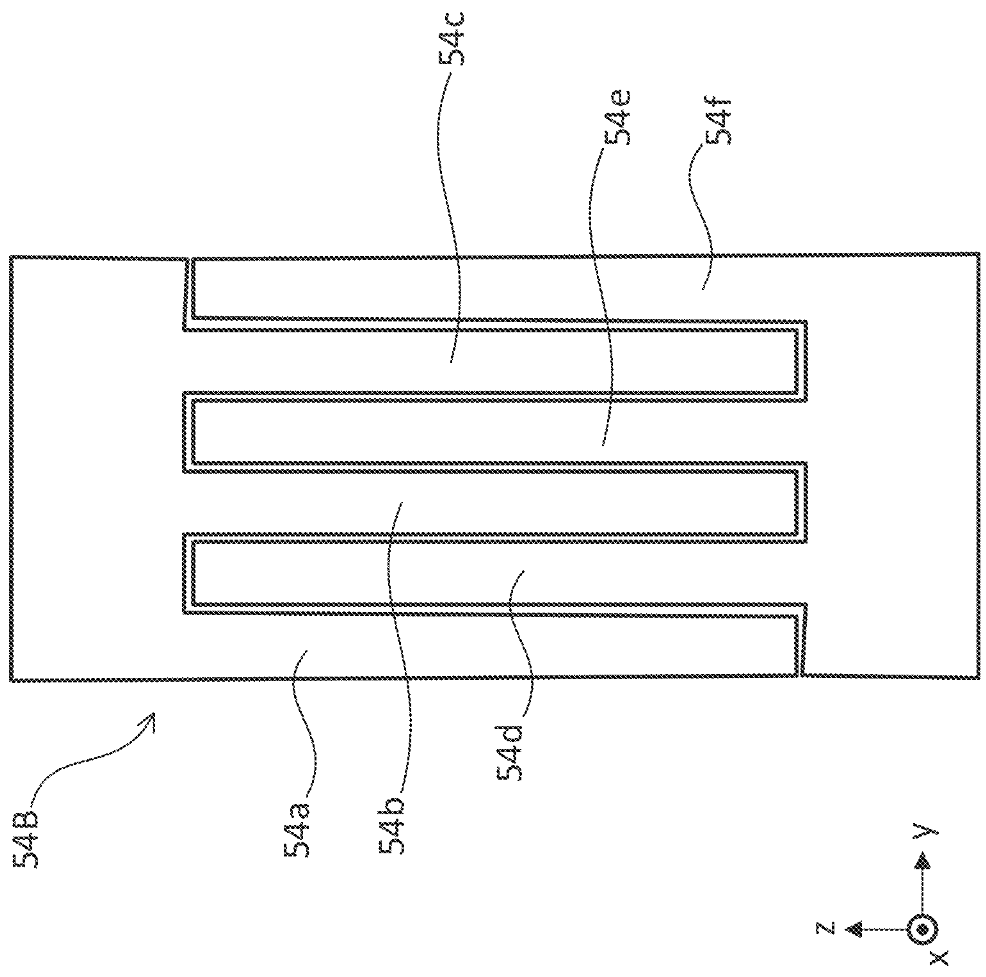
FIG. 10 is an enlarged view of the electric field concentrated part.

The changing of the resonance frequency f will now be described with reference to FIGS. 9 and 10. FIG. 9 is an enlarged view of an electric field concentrated part 54A. FIG. 10 is an enlarged view of an electric field concentrated part 54B.

Each of the electric field concentrated parts 54A and 54B is an example of the electric field concentrated part 54, and is formed from coil elements 54*a* to 54*f*. The electric field concentrated part 54A and the electric field concentrated part 54B are identical to each other except that they have different lengths a for each of the coil elements 54*a* to 54*f*. The length a of the coil element of the electric field concentrated part 54A is shorter than the length a of the coil element of the electric field concentrated part 54B.

As the length a of the coil element becomes shorter, the capacitance C becomes smaller (refer to Equation (2)), and, as a result, the resonance frequency f becomes higher (refer to Equation (1)). Conversely, as the length a of the coil element becomes longer, the capacitance C becomes larger, and, as a result, the resonance frequency f becomes lower.

That is, the resonance frequency f of the coil having the electric field concentrated part 54A is higher than the resonance frequency f of the coil having the electric field concentrated part 54B. In other words, with the electric field concentrated part 54A, a coil having a higher resonance frequency f is formed, and, with the electric field concentrated part 54B, a coil having a lower resonance frequency f is formed.

When the electric field concentrated part 54A is used as the electric field concentrated part, the same electric field concentrated part 54A is formed in the coils 44, 46, 50, and 52. When the electric field concentrated part 54B is used as the electric field concentrated part, the same electric field concentrated part 54B is formed in the coils 44, 46, 50, and 52.

As described, the resonance frequency f of the sample coils 16 can be changed by simply changing the length a of the coil elements of each of the coils 44, 46, 50, and 52. Because of this, the resonance frequency f of the sample coils 16 can be changed without changing the size of the coils 44, 46, 50, and 52.

For example, in a case in which a general spiral coil is used as a sample coil, when the resonance frequency is to be changed, it is necessary to change the number of windings of the spiral coil. More specifically, in order to realize a lower resonance frequency, the number of windings must be increased. However, as the number of windings is increased, the size of the spiral coil is also increased. Because the space for housing the sample coil is limited, when a sample coil with a lower resonance frequency is to be used, a corresponding space must be secured, or, because the space is limited, a limitation is imposed on the resonance frequency that can be realized.

On the other hand, in the present embodiment, the resonance frequency f of the sample coils 16 can be changed by simply changing the length a of the coil element, and without changing the size of the coils 44, 46, 50, and 52.

The electric field concentrated part 54 has a shape in accordance with the resonance frequency of the sample 18. That is, the length a of the coil element is set to a length which enables realization of a resonance frequency f which is equal to the resonance frequency of the sample 18 to be measured. In this manner, with the use of the sample coils 16 having the length a of the coil element changed in accordance with the sample 18, NMR measurement of various samples 18 can be performed by simply changing the sample coils 16. For example, the length a may be changed in accordance with the nuclear species such as 13C, 19F, 15N, or 31P, so that the NMR measurement of these nuclear species may be performed.

Figure 11:
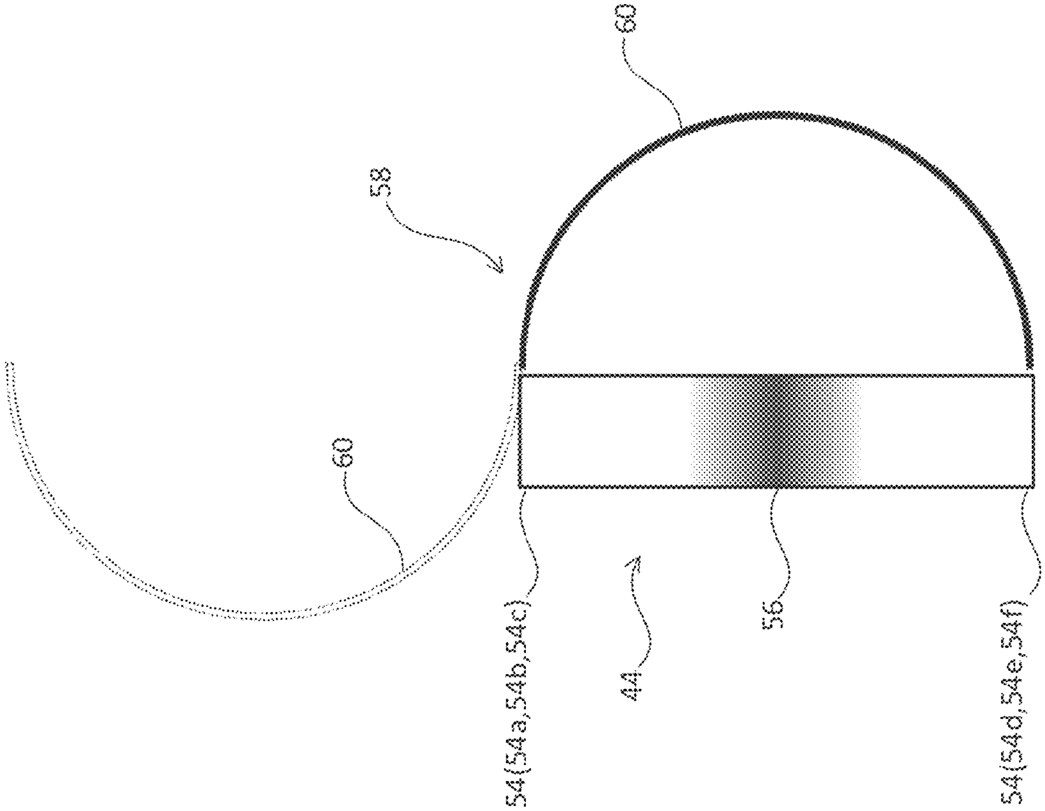
FIG. 11 is an unfolded view of the coil.

The current concentrated part 56 will now be described with reference to FIG. 11. FIG. 11 is an unfolded view of the coil 44. That is, FIG. 11 shows a state in which the coil 44 is unfolded in a straight line shape, by virtually separating the coil elements 54*a* to 54*c* forming the electric field concentrated part 54, and the coil elements 54*d* to 54*f* forming the electric field concentrated part 54.

A waveform 58 schematically shows a waveform of a high-frequency current. A waveform 60 schematically shows a waveform of a half wavelength of the high-frequency current.

A full length of the coil 44 is determined so that the coil 44 resonates at a half wavelength ($\lambda/2$) of the high-frequency current (high-frequency magnetic field $B_1$) supplied to the coil 44. For example, the full length of the coil 44 has a length of a half wavelength of the high-frequency current (high-frequency magnetic field $B_1$). With this configuration, when the high-frequency current is supplied to the coil 44, a current is concentrated at a center part of the coil 44 of the straight line shape. This center part is the current concentrated part 56.

The coil 44 is formed on the planar substrate 42 so that the center part of the coil 44 (that is, the current concentrated part 56) when the coil 44 is virtually extended in the straight line shape is placed at a position proximal to the sample 18. The coils 46, 50, and 52 are similarly configured.

By placing the current concentrated part 56 at a position proximal to the sample 18, a high-frequency magnetic field $B_1$ can be generated, which is stronger than that in the case in which the current concentrated part 56 is placed at a position distal from the sample 18.

Figure 12:
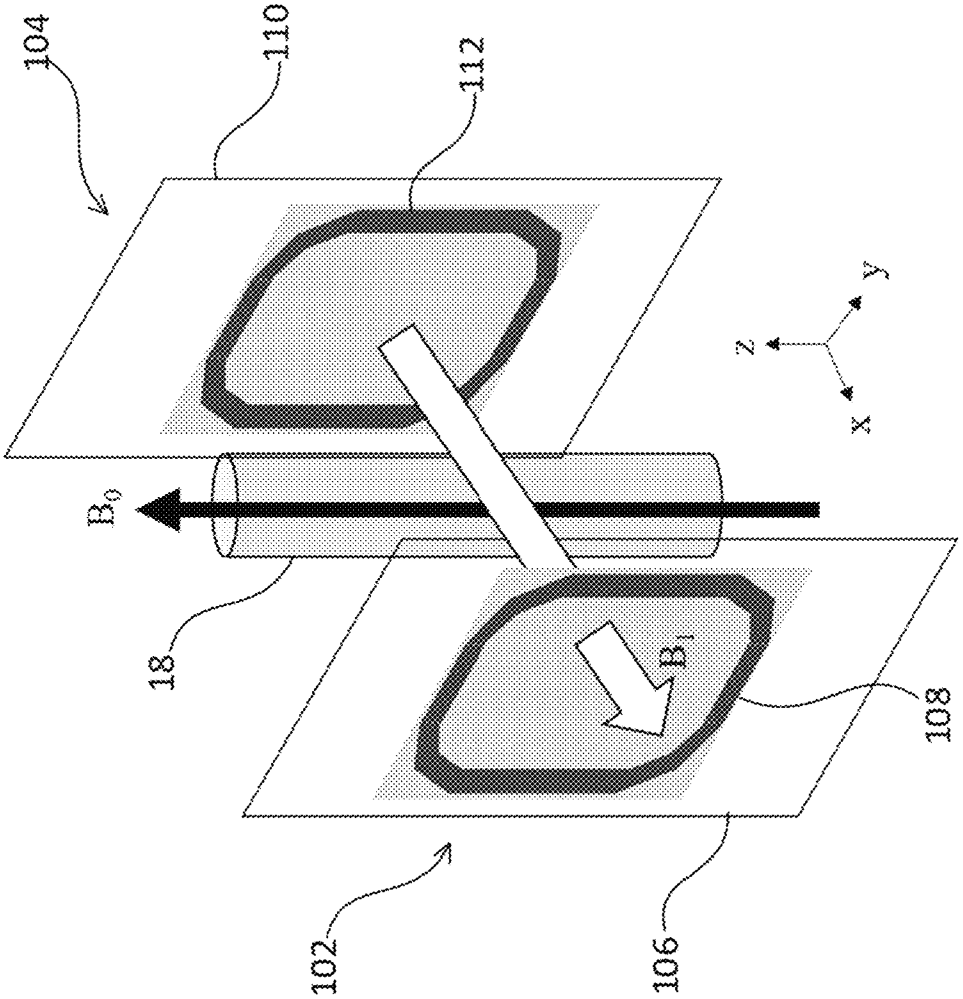
FIG. 12 is a perspective diagram showing sample coils in a comparative example.
Figure 13:
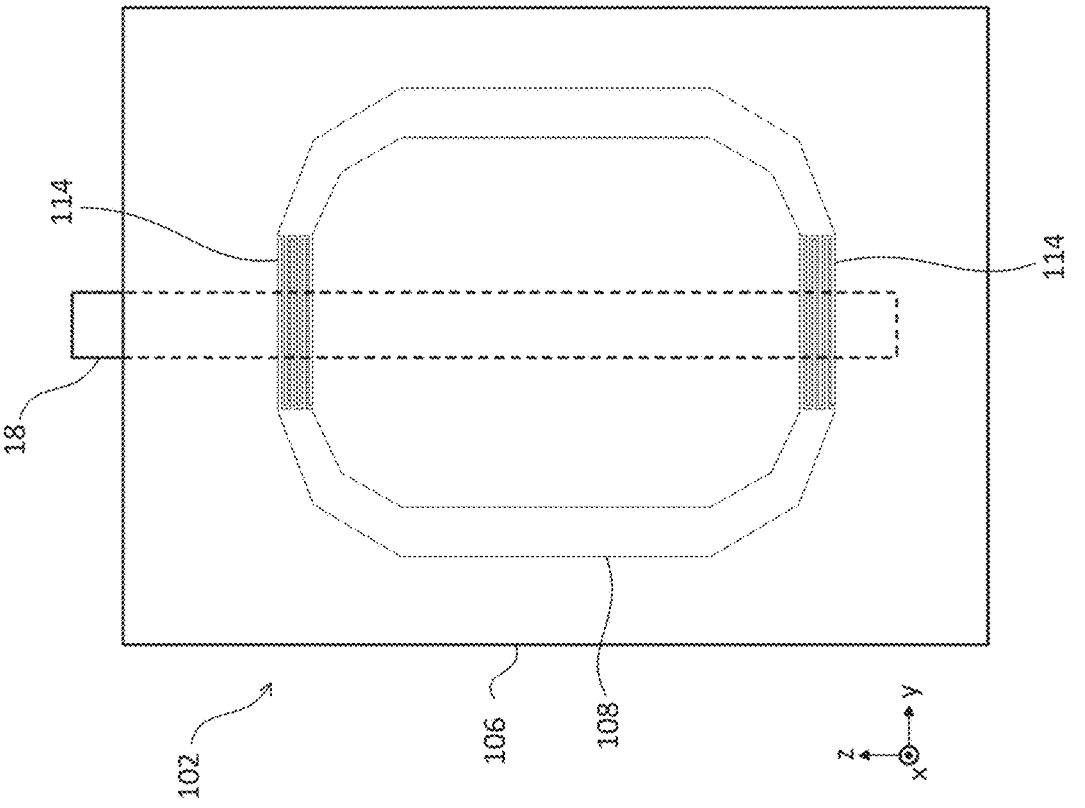
FIG. 13 is a diagram of the sample coils in the comparative example, as viewed from the x direction.

A pair of sample coils according to a comparative example will now be described with reference to FIGS. 12 and 13. FIG. 12 is a perspective diagram of a pair of sample coils according to the comparative example, and FIG. 13 is a diagram showing one sample coil of the comparative example, as viewed from the x direction.

As shown in FIG. 12, a pair of sample coils of the comparative example is specifically formed from a first coil unit 102 and a second coil unit 104. The first coil unit 102 and the second coil unit 104 are placed with the sample 18 therebetween.

The first coil unit 102 includes a planar substrate 106 and a coil 108. The second coil unit 104 includes a planar substrate 110 and a coil 112. The planar substrates 106 and 110 are, for example, sapphire substrates. The coils 108 and 112 are formed from superconductors, and have a wound shape. The coils 108 and 112 are identical in shape.

When the coil 108 is viewed from the x direction orthogonal to the planar substrate 106, the coil 108 intersects the sample 18. Similarly, when the coil 112 is viewed from the x direction orthogonal to the planar substrate 110, the coil 112 intersects the sample 18.

As shown in FIG. 13, in the first coil unit 102, the coil 108 includes two electric field concentrated parts 114. One of the electric field concentrated parts 114 is formed at an upper part of the coil 108, and the other of the electric field concentrated parts 114 is formed at a lower part of the coil 108. When the coil 108 is viewed from the x direction, the two electric field concentrated parts 114 intersect the sample 18. Similar to the coil 108, the coil 112 includes two electric field concentrated parts 114. When the coil 112 is viewed from the x direction, the two electric field concentrated parts 114 intersect the sample 18, As described, in the sample coils of the comparative example, when the coils 108 and 112 are viewed from the x direction, the four electric field concentrated parts 114 intersect the sample 18. That is, the coils 108 and 112 (more specifically, the electric field concentrated parts 114) extend across a space in which the static magnetic field $B_0$ is formed, in particular, four local spaces proximal to the sample 18. As a result, a distortion is caused in the static magnetic field $B_0$ in the four local spaces, and, due to an influence of this distortion, a distortion is consequently caused in the static magnetic field $B_0$ in the sample space. That is, a uniform static magnetic field $B_0$ cannot be formed in the sample space.

On the other hand, in the case of the sample coils 16 according to the present embodiment, because the sample coils 16 do not extend across the four local spaces, the distortion is not caused in the static magnetic field $B_0$ in the sample space, or the generation of such a distortion can be suppressed. In other words, a uniform static magnetic field $B_0$ can be formed in the sample space.

Figure 14:
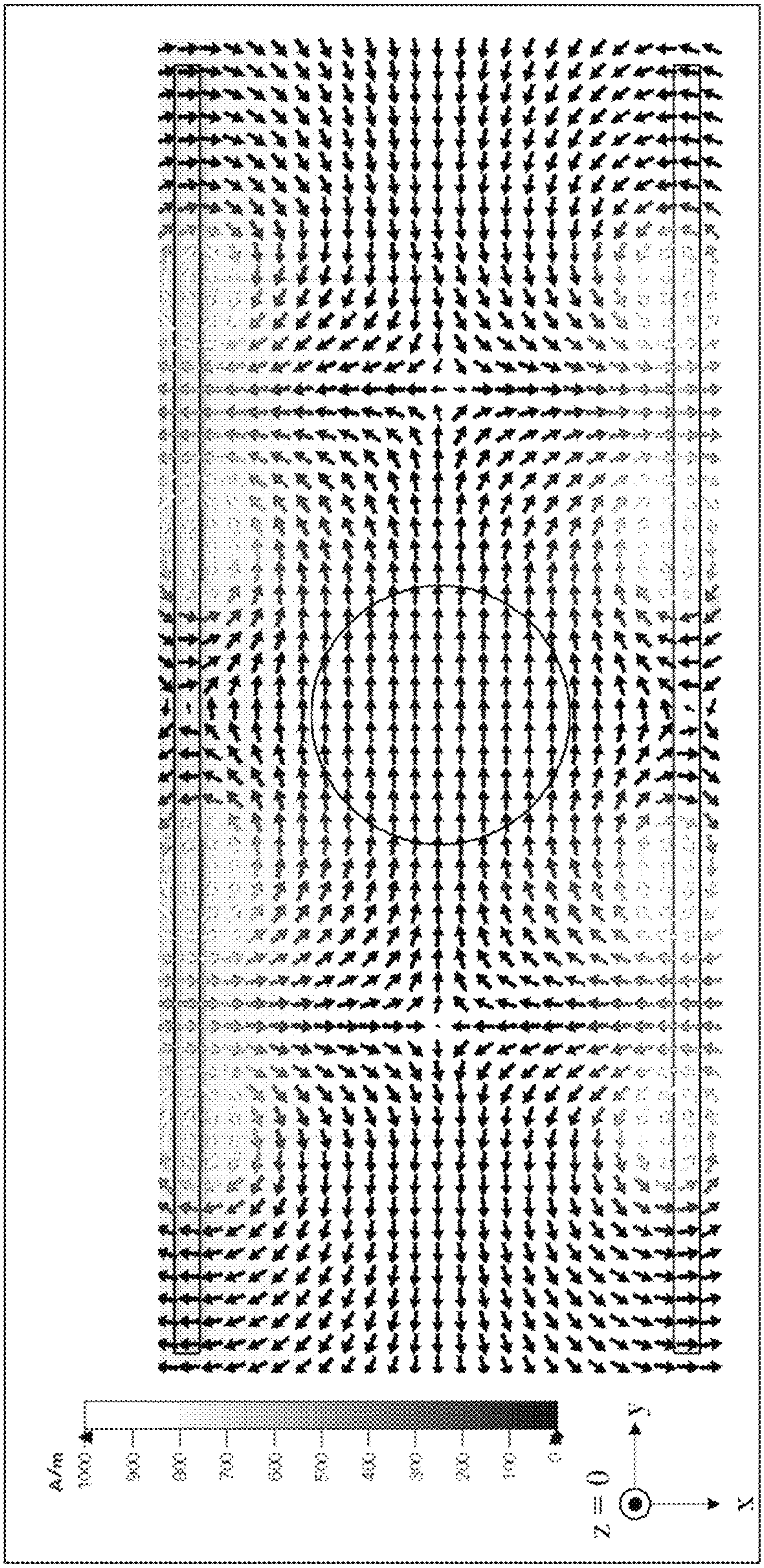
FIG. 14 is a diagram showing a result of calculation of a distribution of a high-frequency magnetic field generated by the sample coil according to the embodiment of the present disclosure.

A distribution of the high-frequency magnetic field $B_1$ generated by the sample coils 16 will now be described with reference to FIG. 14. FIG. 14 shows a result of calculation of the distribution of the high-frequency magnetic field $B_1$.

Here, as an example, a distribution of the high-frequency magnetic field $B_1$ generated by the sample coils 16 is calculated using a three-dimensional electromagnetic field simulator (CST Studio Suite, AET). FIG. 14 shows a distribution of the high-frequency magnetic field $B_1$ as viewed from the z direction. Arrows shown in FIG. 14 show the directions of the high-frequency magnetic field $B_1$. The degree of shading of the arrows expresses a magnitude of the high-frequency magnetic field $B_1$.

In a region in which the sample 18 is placed (a region surrounded by a circle), the direction of the high-frequency magnetic field $B_1$ coincides or approximately coincides with the direction of the y axis, and is constant. The magnitude of the high-frequency magnetic field $B_1$ is also constant or approximately constant. In this manner, it can be understood that, in the region in which the sample 18 is placed, a uniform high-frequency magnetic field $B_1$ is formed.

Figure 15:
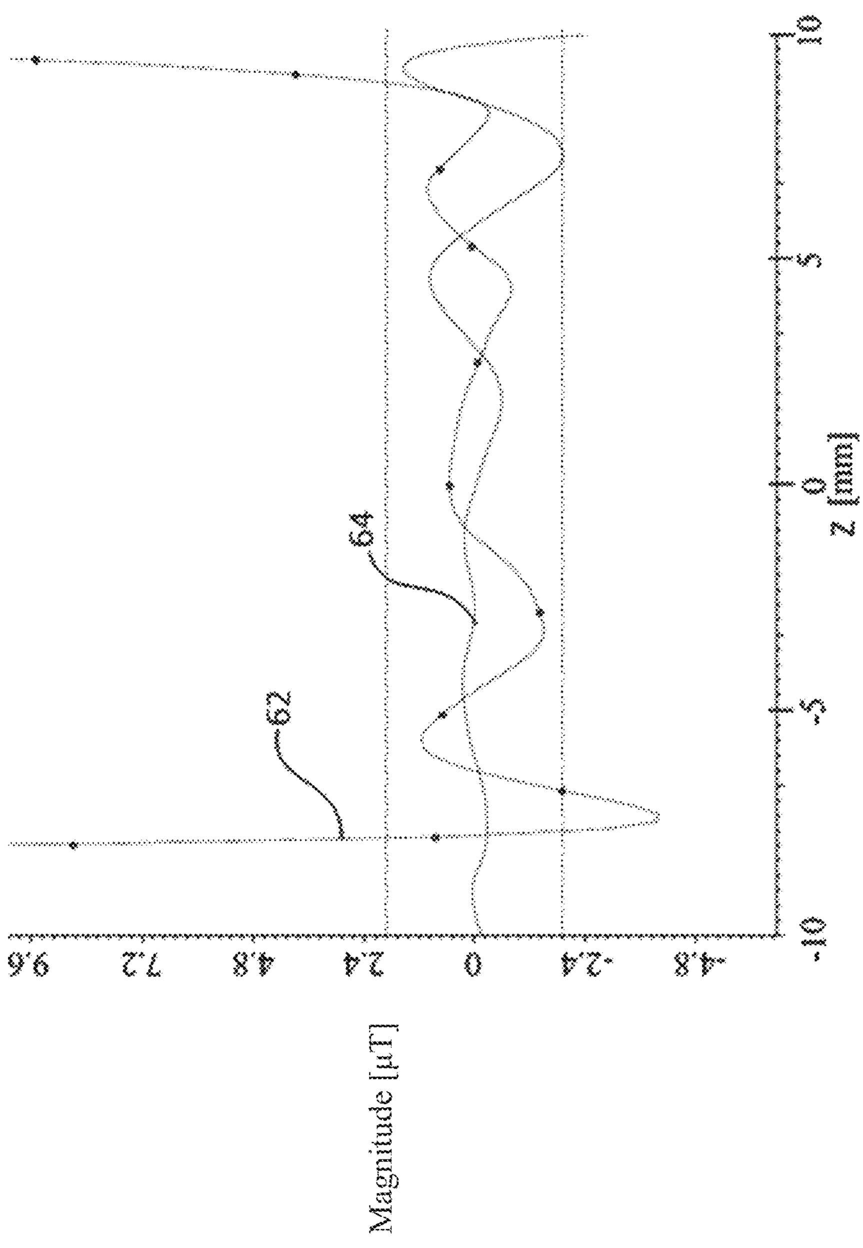
FIG. 15 is a diagram showing a result of measurement of a static magnetic field.

A result of measurement of the static magnetic field $B_0$ will now be described with reference to FIG. 15. FIG. 15 shows a result of measurement of the static magnetic field $B_0$. The horizontal axis shows a position along the z direction, and the vertical axis shows the magnitude of the static magnetic field $B_0$. A position of z=0 is the center of the region in which the sample 18 is placed.

A graph 62 is a graph representing the comparative example. That is, when the sample coils 102 and 104 of the comparative example are used, a static magnetic field $B_0$ having the distribution shown by the graph 62 is formed. A graph 64 is a graph representing the embodiment of the present disclosure. That is, when the sample coils 16 according to the embodiment are used, a static magnetic field $B_0$ having the distribution shown by the graph 64 is formed.

As shown by the graph 62, when the sample coils 102 and 104 according to the comparative example are used, the distortion of the static magnetic field $B_0$ is significant. On the other hand, as shown by the graph 64, when the sample coils 16 according to the embodiment are used, the distortion of the static magnetic field $B_0$ is small, and occurrence of the distortion is suppressed.

For example, in a wide range in the z direction, the distortion of the static magnetic field $B_0$ is required to be within ±1.9 μT (microtesla). In the comparative example, this requirement is not satisfied, and distortion is caused in the NMR spectrum. On the other hand, according to the present embodiment, because this requirement can be satisfied, the distortion does not occur in the NMR spectrum, or the occurrence of the distortion can be suppressed.

Figure 16:
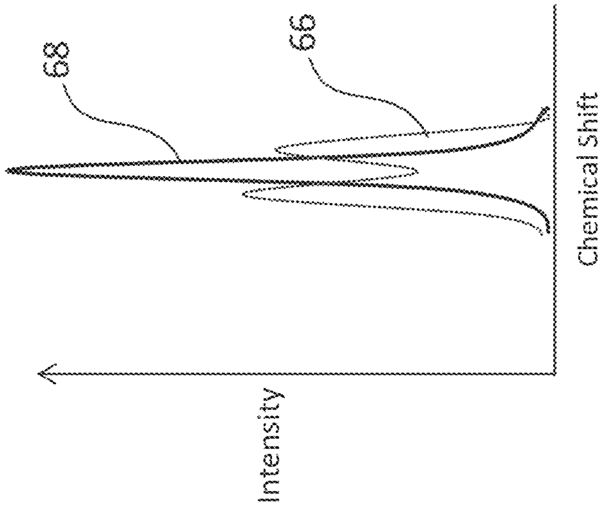
FIG. 16 is a diagram showing a distribution of a signal intensity with respect to a chemical shift.

An intensity of the NMR signal which is detected will now be described with reference to FIG. 16. FIG. 16 shows a distribution of a signal intensity with respect to a chemical shift. The horizontal axis shows a chemical shift of the high-frequency magnetic field $B_1$, and the vertical axis shows the intensity of the detected NMR signal.

A graph 66 is a graph representing the comparative example. That is, when the sample coils 102 and 104 of the comparative example are used, an NMR signal having the signal intensity shown by the graph 66 is detected. A graph 68 is a graph representing the embodiment of the present disclosure. That is, when the sample coils 16 of the embodiment are used, an NMR signal having the signal intensity shown by the graph 68 is detected.

As described above, when the sample coils 102 and 104 of the comparative example are used, the distortion of the static magnetic field $B_0$ is significant. Because of this, the intensity of the detected NMR signal becomes low, and also, the distribution of the NMR signal is split. As a result, the NMR spectrum is split, and the intensity becomes low.

On the other hand, when the sample coils 16 of the embodiment are used, the distortion of the static magnetic field $B_0$ is smaller in comparison to the comparative example. Because of this, the intensity of the detected NMR signal is higher in comparison to the intensity in the comparative example. In addition, the splitting of the distribution of the NMR signal does not occur. As a result, the splitting of the NMR spectrum is suppressed, and an NMR spectrum with a high intensity can be obtained.

Figure 17:
FIG. 17 is a diagram showing a result of measurement of a loaded Q factor.

A result of measurement of a loaded Q factor will now be described with reference to FIG. 17. FIG. 17 shows a result of measurement of the loaded Q factor. The vertical axis shows the loaded Q factor.

Graphs 70 and 72 represent loaded Q factors measured when the sample 18 is not inserted in the probe 14. The graph 70 is a graph representing the embodiment of the present disclosure. That is, when the sample coils 16 according to the embodiment are used, the loaded Q factor shown by the graph 70 is measured. The graph 72 is a graph representing the comparative example. Here, copper sample coils are used as the sample coils of the comparative example. When the copper sample coils are used, the loaded Q factor shown by the graph 72 is measured.

Graphs 74 and 76 represent loaded Q factors measured when the sample 18 is inserted in the probe 14. Here, a deuterated solvent sample ($D_2O$) is used as the sample 18. The graph 74 is a graph representing the embodiment of the present disclosure. That is, when the sample coils 16 according to the embodiment are used, the loaded Q factor shown by the graph 74 is measured. The graph 76 is a graph representing the comparative example. That is, when the copper sample coils are used, the loaded Q factor shown by the graph 76 is measured.

As shown by graphs 70 and 72, when the sample 18 is not inserted in the NMR probe 14, the loaded Q factor of the embodiment is higher than the loaded Q factor of the comparative example. Here, the loaded Q factor of the embodiment is about 28 times the loaded Q factor of the comparative example.

As shown by the graphs 74 and 76, when the sample 18 is inserted in the NMR probe 14 also, the loaded Q factor of the embodiment is higher than the loaded Q factor of the comparative example. Here, the loaded Q factor of the embodiment is about 20 times the loaded Q factor of the comparative example.

As described, when the sample coils 16 according to the embodiment are used, the high loaded Q factor can be maintained even when the sample 18 is inserted in the NMR probe 14. Because of this, the detection sensitivity of the NMR signal can be improved in comparison to the comparative example.

In addition, as shown in FIGS. 2, 3, 5, and 11, in the present embodiment, the current concentrated part 56 is formed in the part proximal to the sample 18 (that is, an inner part of each of the coils 44, 46, 50, and 52). As a result, the current concentrated part 56 formed in the proximal part is formed at a position farther away from an inner wall surface of a tubular casing of the NMR probe 14, in comparison to the case in which the current concentrated part 56 is formed in the part distal from the sample 18 (that is, an outer part of each of the coils 44, 46, 50, and 52). With this configuration, an eddy current generated in the inner wall surface of the NMR probe 14 can be reduced. As a result, the influence of conductor loss on the sample coils 16 received from the inner wall surface can be reduced, and the reduction of the Q factor of the sample coils 16 due to the conductor loss can be suppressed.

Figure 18:
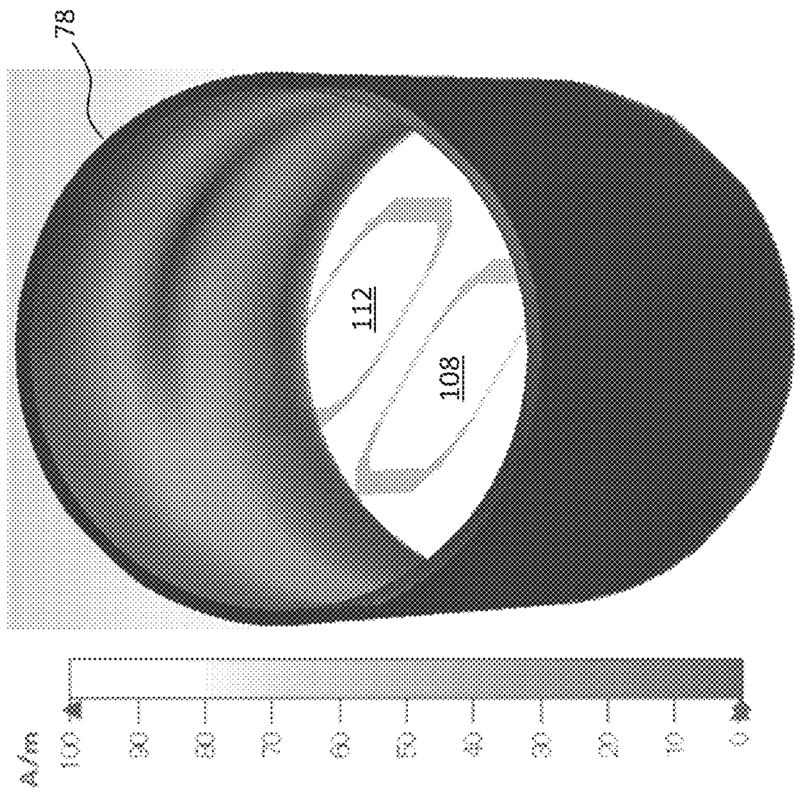
FIG. 18 is a diagram showing a current distribution in a comparative example.
Figure 19:
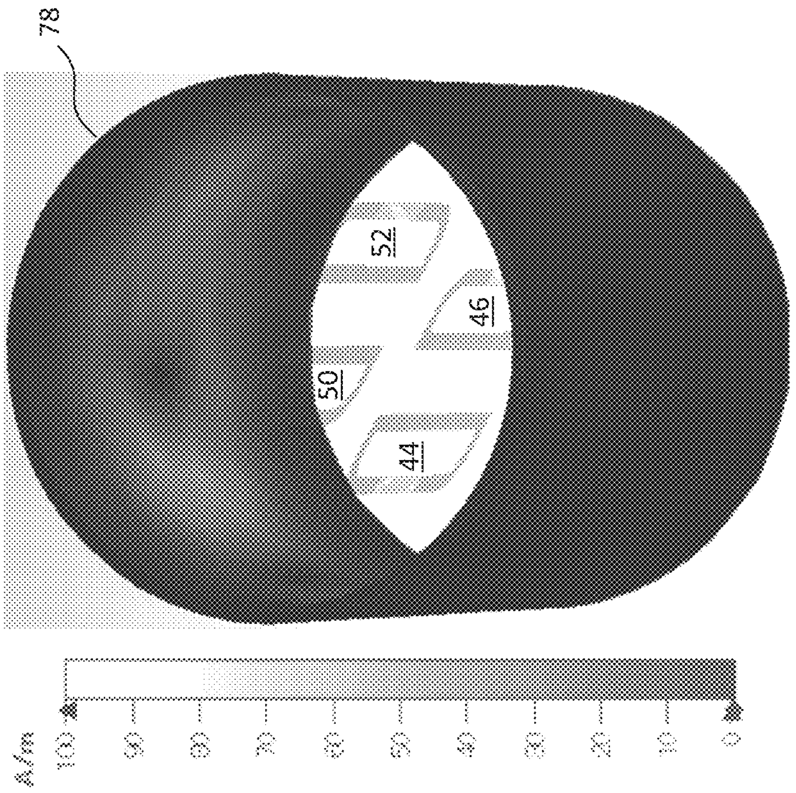
FIG. 19 is a diagram showing a current distribution in the embodiment of the present disclosure.

The eddy current generated in the inner wall surface of the casing will now be described with reference to FIGS. 18 and 19. FIG. 18 shows a current distribution in the comparative example. FIG. 19 shows a current distribution in the embodiment of the present disclosure. Each current distribution is a result of analysis by an electromagnetic field simulator.

An inner wall surface 78 is the inner wall surface of the NMR probe 14. A size of the eddy current generated in the inner wall surface 78 is expressed by the degree of shading.

The current concentrated part of each of the coils 108 and 112 according to the comparative example is placed at a position proximal to the inner wall surface 78. On the other hand, the current concentrated part 56 of each of the coils 44, 46, 50 and 52 according to the embodiment is placed at a position farther away from the inner wall surface 78 in comparison to the comparative example.

When the coils 108 and 112 according to the comparative example are used, the current distribution shown in FIG. 18 is formed. When the coils 44, 46, 50 and 52 according to the embodiment are used, the current distribution shown in FIG. 19 is formed.

In the comparative example, a large eddy current is generated in the inner wall surface 78. In the contrary, in the present embodiment, the eddy current generated in the inner wall surface 78 is smaller than the eddy current generated in the comparative example. Therefore, according to the present embodiment, the influence of the conductor loss on the coils 44, 46, 50 and 52 received from the inner wall surface 78 can be reduced, and the reduction of the Q factor of the sample coils 44, 46, 50 and 52 can be suppressed.

Normally, a higher Q factor of a coil results in increased eddy current generated in the inner wall surface 78, resulting in occurrence of a higher conductor loss and reduction of the Q factor of the sample coil. According to the present embodiment, because the generation of the eddy current can be suppressed, the reduction of the Q factor of the sample coils 44, 46, 50 and 52 can be suppressed.

A shape of an inner circumferential edge of the coil according to the embodiment of the present disclosure will now be described. Here, with reference to FIG. 5, the shape of the inner circumferential edges of the coils 44 and 46 will be described.

The number of windings of the coil 44 is one, and, with this structure, an inner circumferential edge 44*a* is formed on the coil 44. Similarly, the number of windings of the coil 46 is one, and, with this structure, an inner circumferential edge 46*a* is formed on the coil 46. The inner circumferential edge 44*a* is an edge at an inner side of the coil 44. The inner circumferential edge 46*a* is an edge at an inner side of the coil 46.

The inner circumferential edge 44*a* has two bent portions 44*b*. Each bent portion 44*b* does not have a shape of a right angle, but has a shape of a curved line, that is, a curved shape. The inner circumferential edge 46*a* also has two bent portions 46*b*. Similar to the bent portion 44*b*, each bent portion 46*b* does not have a shape of a right angle, and has a shape of a curved line. The inner circumferential edges of the coils 50 and 52 have a similar shape. From a different perspective, each of the coils 44 and 46 has two corner portions extending over a first vertical part (part at an inner side) and two horizontal parts. An inner edge of each corner portion has a circular arc shape.

When the shape of the bent portion is the right angle shape (that is, a shape with an angle of) 90°, the current concentrates at the bent portion, and there is a possibility that the superconducting state is destroyed. When the shape of the bent portion is a curved line shape as in the present embodiment, the concentration of the current at the bent portion can be prevented or suppressed, and the destruction of the superconducting state can be prevented or suppressed.

Figure 20:
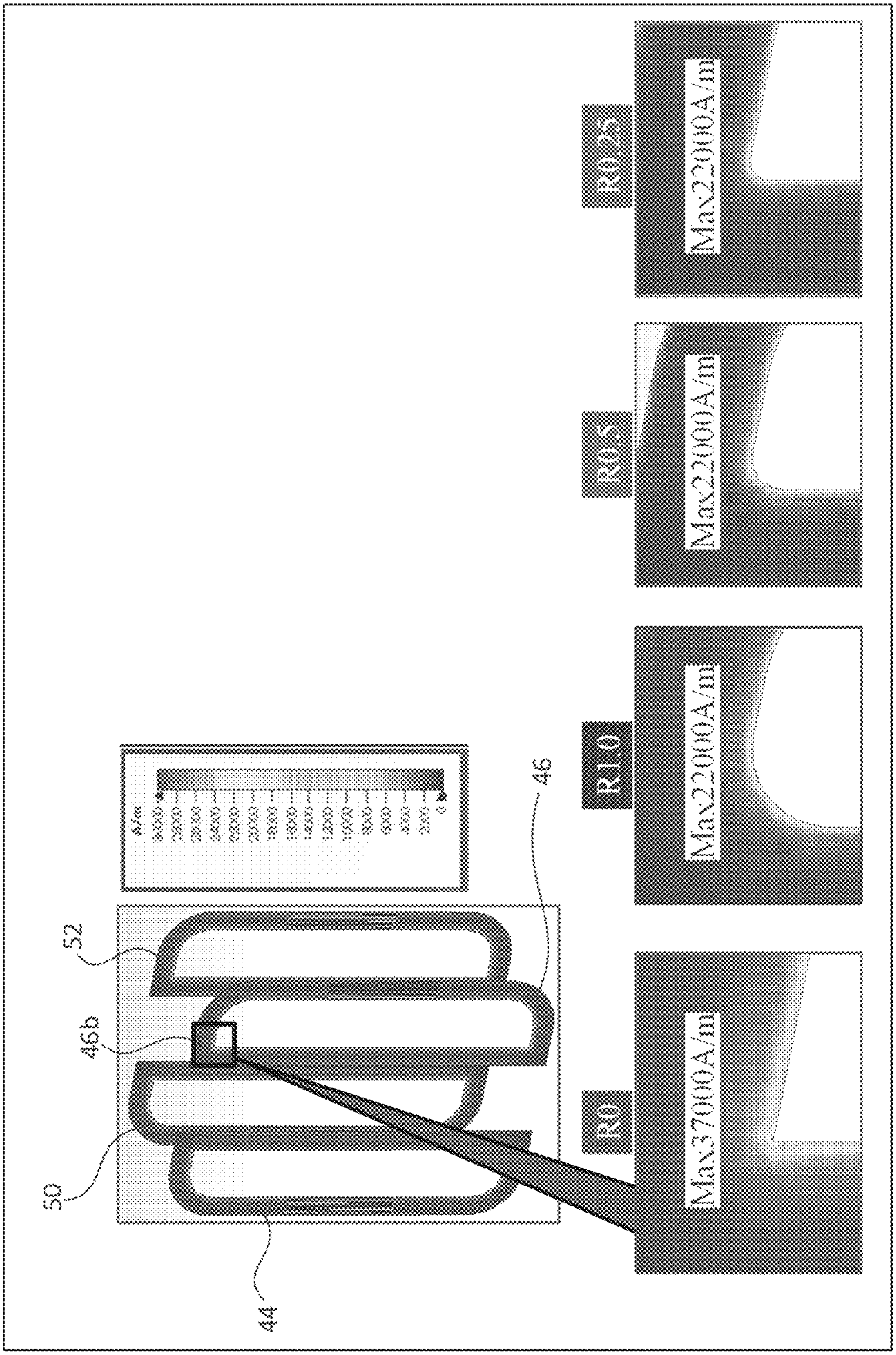
FIG. 20 is a diagram showing a current distribution caused at a corner portion.
Figure 21:
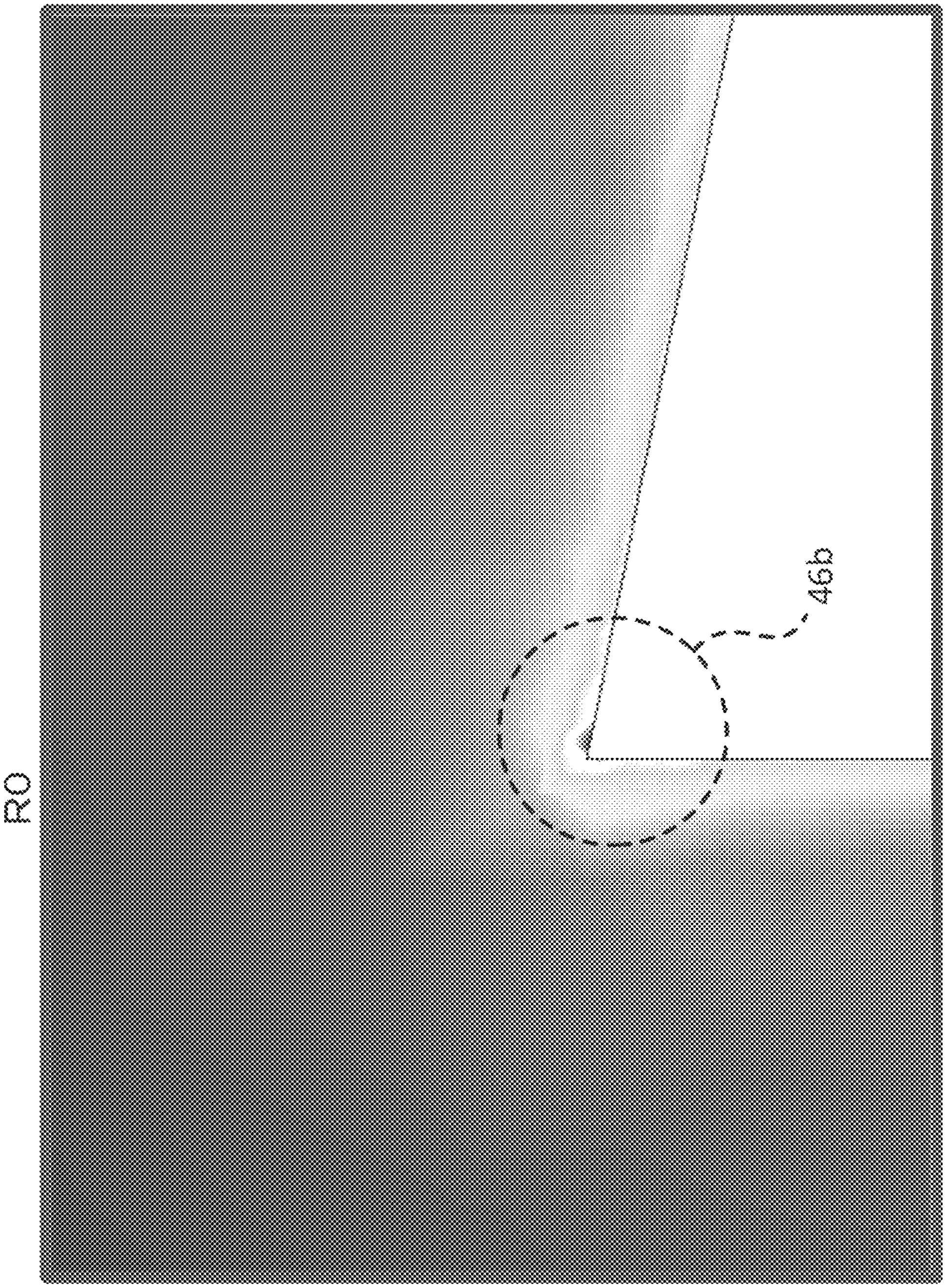
FIG. 21 is a diagram showing a current distribution caused at the corner portion.
Figure 22:
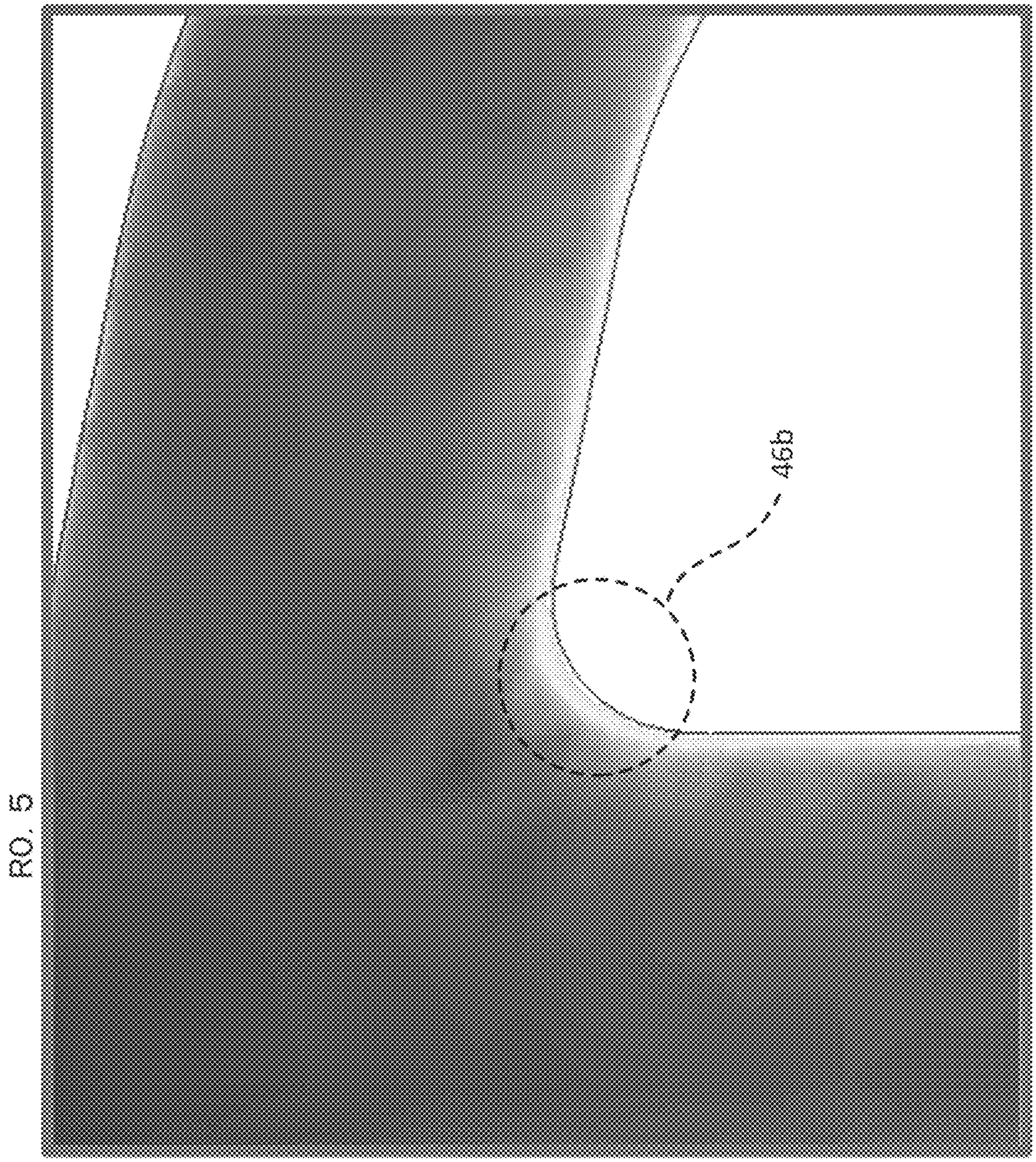
FIG. 22 is a diagram showing a current distribution caused at the corner portion.

Concentration of current at the bent portion will now be described with reference to FIGS. 20 to 22. FIGS. 20 to 22 show distributions of currents generated in the coils 44, 46, 50, and 52. The current distribution is a result of analysis by an electromagnetic field simulator. A size of the current is expressed with the degree of shading.

FIG. 20 shows a distribution of a current generated in the bent portion 46*b* in each of the cases where "R=0" ("R0" in FIG. 20), "R=1.0" ("R1.0" in FIG. 20), "R=0.5" ("R0.5" in FIG. 20), and "R=0.25" ("R0.25" in FIG. 20). R represents a radius of curvature. A current distribution corresponding to "R0" is a current distribution when the shape of the bent portion 46*b* is the right angle shape. Three current distributions corresponding to "R1.0", "R0.5", and "R0.25" are current distributions when the shape of the bent portion 46*b* is the curved line shape.

FIG. 21 shows the current distribution corresponding to "R0". FIG. 22 shows the current distribution corresponding to "R0.5". As shown in FIG. 21, when the shape of the bent portion 46*b* is the right angle shape, the current concentrates at the bent portion 46*b*. On the other hand, as shown in FIG. 22, when the shape of the bent portion 46*b* is the curved line shape, the concentration of the current at the bent portion 46*b* can be suppressed. For example, the size of the current can be suppressed to about 60% of the size of the current in the case of "R0". As a result, the destruction of the superconducting state due to the concentration of the current can be prevented or suppressed. While FIGS. 20 to 22 show distributions of currents generated in the bent portion 46*b*, a similar result can be obtained for the other bent portions.

Advantages realized by the sample coil 16 according to the present embodiment shown in FIG. 2 and the like are summarized in the following Because the sample coils 16 (more specifically, the coils 44, 46, 50, and 52) do not intersect the sample 18 when viewed from the x direction, the occurrence of the distortion of the static magnetic field $B_0$ can be suppressed.

Because the electric field concentrated part 54 is formed at a position distal from the sample 18, when the sample 18 is inserted in the NMR probe 14, the reduction of the Q factor of the sample coils 16 can be suppressed. As a result, the reduction of the detection sensitivity due to the insertion of the sample 18 can be suppressed.

The resonance frequency of the sample coils 16 can be changed by changing the length a of the coil element forming the electric field concentrated part 54, without changing the size of the sample coils 16 as a whole.

Because the current concentrated part 56 is formed at a position proximal to the sample 18, a uniform and strong high-frequency magnetic field $B_1$ can be applied to the sample 18. In addition, because the current concentrated part 56 is formed at a position distant from the inner wall surface of the NMR probe 14, the influence of the dielectric loss received from the inner wall surface can be reduced.

As described, according to the present embodiment, the detection sensitivity of the NMR signal can be improved without adversely affecting the advantages which can be obtained by forming the sample coils 16 with a superconductor.

The invention claimed is:

1. An NMR detector comprising:

a first coil unit that comprises a first superconducting coil, and a first plane on which the first superconducting coil is formed; and a second coil unit that comprises a second superconducting coil, and a second plane on which the second superconducting coil is formed, and that opposes the first coil unit, wherein the first coil unit and the second coil unit radiate electromagnetic waves for generating a high-frequency magnetic field onto a sample placed in a static magnetic field between the first coil unit and the second coil unit, and detect an NMR signal from the sample, the first superconducting coil does not intersect the sample when viewed from a direction orthogonal to the first plane, and the second superconducting coil does not intersect the sample when viewed from a direction orthogonal to the second plane, wherein the first superconducting coil comprises:

a first coil; and a second coil placed at a position distanced from the first coil, wherein a distance between the first coil and the second coil is greater than or equal to a width of the sample, and the second superconducting coil comprises:

a third coil; and a fourth coil placed at a position distanced from the third coil, wherein a distance between the third coil and the fourth coil is greater than or equal to the width of the sample.

2. The NMR detector according to claim 1, wherein each of the first coil, the second coil, the third coil, and the fourth coil comprises an electric field concentrated part.

3. The NMR detector according to claim 2, wherein each of the first coil, the second coil, the third coil, and the fourth coil comprises a part proximal to the sample and a part distal from the sample, and the part distal from the sample comprises the electric field concentrated part.

4. The NMR detector according to claim 2, wherein the electric field concentrated part has a first coil end formed from a plurality of first elements arranged in a comb shape, and a second coil end formed from a plurality of second elements arranged in a comb shape, and the plurality of first elements and the plurality of second elements are provided in a staggered manner.

5. The NMR detector according to claim 4, wherein the electric field concentrated part has a shape in accordance with a resonance frequency of the sample.

6. The NMR detector according to claim 1, wherein each of the first coil, the second coil, the third coil, and the fourth coil comprises a current concentrated part.

7. The NMR detector according to claim 6, wherein each of the first coil, the second coil, the third coil, and the fourth coil comprises a part proximal to the sample and a part distal from the sample, and the part proximal to the sample comprises the current concentrated part.

8. The NMR detector according to claim 7, wherein a full length of each of the first coil, the second coil, the third coil, and the fourth coil corresponds to a half wavelength of a high-frequency magnetic field applied to the sample.

9. The NMR detector according to claim 1, wherein each of the first coil, the second coil, the third coil, and the fourth coil is a coil placed on a planar substrate, and an inner edge of a corner portion in each of the coils has a curved line shape.

10. The NMR detector according to claim 1, wherein a z direction which is a direction of the static magnetic field, an x direction which is orthogonal to the z direction and which is a direction of alignment of the first coil unit and the second coil unit, and a y direction orthogonal to the x direction and the z direction are defined, the first coil unit comprises a first substrate having the first plane on which the first coil and the second coil, which are aligned in the y direction, are formed, the second coil unit comprises a second substrate having the second plane on which the third coil and the fourth coil, which are aligned in the y direction, are formed, and when viewed from the x direction, the first coil and the second coil do not overlap the sample, and the third coil and the fourth coil do not overlap the sample.

* * * * *